United States Patent
Seo et al.

(10) Patent No.: US 7,622,863 B2
(45) Date of Patent: Nov. 24, 2009

(54) LIGHT-EMITTING DEVICE AND ELECTRONIC DEVICE INCLUDING FIRST AND SECOND LIGHT EMITTING ELEMENTS

(75) Inventors: Satoshi Seo, Kanagawa (JP); Harue Nakashima, Kanagawa (JP); Yukie Nemoto, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 334 days.

(21) Appl. No.: 10/873,290

(22) Filed: Jun. 23, 2004

(65) Prior Publication Data
US 2004/0263056 A1    Dec. 30, 2004

(30) Foreign Application Priority Data
Jun. 30, 2003    (JP)    ............................. 2003-187152

(51) Int. Cl.
H05B 33/02    (2006.01)
H05B 33/00    (2006.01)

(52) U.S. Cl. ........................ 313/506; 313/504; 313/505; 257/88; 257/100; 428/690

(58) Field of Classification Search .................. 313/506
See application file for complete search history.

(56) References Cited

U.S. PATENT DOCUMENTS

| | | | |
|---|---|---|---|
| 5,739,545 A * | 4/1998 | Guha et al. | .................... 257/40 |
| 6,035,180 A | 3/2000 | Kubes | |
| 6,304,309 B1 | 10/2001 | Yamanaka | |
| 6,466,292 B1 | 10/2002 | Kim | |
| 6,512,504 B1 | 1/2003 | Yamauchi et al. | |

(Continued)

FOREIGN PATENT DOCUMENTS

EP    0 881 617    12/1998

(Continued)

OTHER PUBLICATIONS

Exhibition of Active Matrix Type Organic EL Display at "13th Flat Panel Display Manufacturing Technology Expo & Conference" by ELDis Group (*in Japanese with full translation*); Jul. 2, 2003.

(Continued)

*Primary Examiner*—Sikha Roy
(74) *Attorney, Agent, or Firm*—Fish & Richardson P.C.

(57) ABSTRACT

The present invention provides a light-emitting device whose volume is small and that has plural display screens, and a personal digital assistant that realizes higher added value by using the same. A light-emitting device of the present invention has a plurality of light-emitting elements in a pixel, and these light-emitting elements emit light in a different direction from each other and a pixel driving element is provided in one of the light-emitting elements. The light-emitting device can display in both front and back sides and independently display images on the both sides. Further, it can provide a higher aperture ratio, which is obtained by adding the aperture ratios of the both sides. Furthermore, it is also possible to see different images on the both sides of an electronic device using a display device of the present invention. Moreover, weight saving and thinning of electronic devices can be realized.

34 Claims, 11 Drawing Sheets

U.S. PATENT DOCUMENTS

| | | | |
|---|---|---|---|
| 6,559,594 B2 * | 5/2003 | Fukunaga et al. | 313/506 |
| 6,580,488 B2 | 6/2003 | Kim | |
| 6,583,770 B1 | 6/2003 | Antila | |
| 6,781,293 B2 * | 8/2004 | Cho | 313/311 |
| 6,805,979 B2 | 10/2004 | Ogura | |
| 6,872,472 B2 | 3/2005 | Liao et al. | |
| 6,888,318 B2 | 5/2005 | Childs | |
| 6,909,240 B2 | 6/2005 | Osame | |
| 6,998,772 B2 * | 2/2006 | Terumoto | 313/504 |
| 7,019,714 B2 | 3/2006 | Uchida | |
| 7,183,707 B2 | 2/2007 | Tyan et al. | |
| 7,381,504 B2 | 6/2008 | Kawaguchi et al. | |
| 2001/0055384 A1 | 12/2001 | Yamazaki | |
| 2002/0037754 A1 | 3/2002 | Hama et al. | |
| 2002/0044782 A1 | 4/2002 | Kota | |
| 2002/0142189 A1 * | 10/2002 | Seo | 428/690 |
| 2002/0191135 A1 | 12/2002 | Kim | |
| 2004/0195965 A1 * | 10/2004 | Yamazaki et al. | 313/506 |
| 2004/0245529 A1 | 12/2004 | Yamazaki | |
| 2004/0245918 A1 | 12/2004 | Lee | |
| 2004/0251823 A1 | 12/2004 | Park | |
| 2004/0263425 A1 | 12/2004 | Anzai | |
| 2005/0052142 A1 | 3/2005 | Iwabuchi | |
| 2005/0062407 A1 | 3/2005 | Suh | |

FOREIGN PATENT DOCUMENTS

| | | |
|---|---|---|
| EP | 1 227 390 | 7/2002 |
| JP | 10-255976 | 9/1998 |
| JP | 2001-155856 | 6/2001 |
| JP | 2001-274880 | 10/2001 |
| JP | 2001-285445 | 10/2001 |
| JP | 2001-297885 | 10/2001 |
| JP | 2001-305525 | 10/2001 |
| JP | 2001-332392 | 11/2001 |
| JP | 2001-345184 | 12/2001 |
| JP | 2001-356714 | 12/2001 |
| JP | 2002289362 A * | 10/2002 |
| JP | 2002-343564 | 11/2002 |
| JP | 3408154 | 3/2003 |
| JP | 3408154 | 5/2003 |
| JP | 2003-317959 | 11/2003 |
| JP | 2003-345271 | 12/2003 |
| WO | WO 99/18590 | 4/1999 |

OTHER PUBLICATIONS

Documents distributed in the "13$^{th}$ Flat Panel Display Manufacturing Technology Expo & Conference" by ELDis Group (5 pages).

"Two-way display developed"; *The Japan Times*; (1 page); Jul. 3, 2003.

"Mass Production of Organic EL Devices"; *Shimotsuke Newspaper* (*in Japanese with full translation*); Jul. 3, 2003.

Documents distributed in the "13$^{th}$ Flat Panel Display Manufacturing Technology Expo & Conference" by ELDis Group (5 pages), Jul. 2, 2003.

* cited by examiner

LIGHT-EMITTING DEVICE AND ELECTRONIC DEVICE INCLUDING FIRST AND SECOND LIGHT EMITTING ELEMENTS

BACKGROUND OF THE INVENTION

1. Field of the Invention

The present invention relates to a light-emitting device in which a pixel portion is formed with a light-emitting element including a light-emitting layer between a pair of electrodes, and the light-emitting layer includes an electroluminescent (light-emitting) material. Specifically, the present invention relates to a light-emitting device that can display images on both sides thereof. Further, the present invention also relates to an electronic device in which both sides thereof are display screens.

2. Description of the Related Art

Further, as for electronic devices, particularly, personal digital assistants such as mobile computers, cellular phones, portable game machines, and electric books, higher added value is required as the result of diversification of the intended use. The electronic devices provided with a sub display screen on the opposite side of a normal display screen has been provided recently (Reference 1: Japanese Patent Laid Open No. 2002-101160).

In recent years, a light-emitting device including a light-emitting element as a self luminous type light-emitting element, for example, as an organic EL display, an inorganic EL display and the like, have been researched and developed actively. The organic EL displays, in particular, have the characteristics of high-definition, high response speed, low voltage, and low electric power consumption driving suitable for displaying a moving image since they are self luminous type, a thinned structure and lightweight because of not having a backlight and therefore, draw attraction as a next generation display such as a personal digital assistant.

A light-emitting element in a light-emitting device has a structure in which a light-emitting material containing layer is formed between a pair of an anode and a cathode, one of which is light-transparent. Electroluminescence is emitted from the light-emitting material containing layer by applying an electric field to the anode and the cathode. In this specification, it should be noted that all layers provided between the cathode and the anode are collectively referred to as a light-emitting material containing layer.

In addition, these light-emitting devices adopt a dot matrix method by which light-emitting elements are arranged in matrix form, and driving methods are classified roughly into a passive matrix driving method (a simple matrix method) or an active matrix driving method.

In a display device employing a passive matrix driving method, an anode and a cathode are arranged in a striped-shape and crossed in matrix form, and a light-emitting material containing layer is formed between each electrode at the crossing point to form a pixel. A luminance signal circuit or a control circuit incorporating a shift register is each provided for an anode and a cathode, and a signal voltage is applied to each electrode in time-series manner by using the circuits and the pixel provided at the crossing point is allowed to emit light selectively. When the display device employing a passive matrix driving method is manufactured, the number of manufacturing steps is small and thus, the manufacturing cost can be reduced (Reference 2: Japanese Patent Laid Open No. 2001-155856)

In a display device employing an active matrix driving method, pixels, which are each made up of an anode, a cathode, and a light-emitting material containing layer provided between the anode and the cathode, are arranged in matrix form and a pixel driving element (such as a transistor or a diode) is provided for each pixel. The pixel driving element is allowed to serve as a switch for switching on-and off-states by a scanning signal, a data signal (such as a display signal or a video signal) is transmitted to a pixel electrode of a light-emitting element through the pixel driving element that is on-state, and the data signal is written in the light-emitting element, thereby making the light-emitting element emit light. In the display device employing an active matrix driving method, a pixel driving element is provided for each pixel, and thus the response speed is high. The display device employing an active matrix driving method is suitable for displaying a moving image (Reference 3: Japanese Patent Laid Open No. 2001-013893). Note that a display device employing an active matrix system is mainly adopted in an organic EL display.

However, as for a personal digital assistant provided with a sub display screen in addition to a main display screen, it is necessary to consider not only a volume occupied by plural modules but also a volume occupied by a substrate and the like on which a control IC for driving the modules or the like is mounted. Particularly, in the personal digital assistants that have been provided recently, reduction in weight, thickness, and size is considerably advanced, but they are trades-off to high added value.

SUMMARY OF THE INVENTION

The present invention has been made in view of the above-described problems. It is an object of the present invention to provide a light-emitting device that can be a module occupying a small volume, and electronic devices, typically, personal digital assistants, in which high added value can be obtained by using the light-emitting device.

A light-emitting device according to the present invention has a plurality of light-emitting elements in a pixel, and these light-emitting elements emit light in a direction different from each other and a pixel driving element is provided in one of the light-emitting elements. In other words, as for the plural light-emitting elements provided in a pixel, one of the light-emitting elements is a light-emitting element by an active matrix driving method and the other is a light-emitting element by a passive matrix driving method or a light-emitting element for area color. By this structure, it is possible to emit light independently on front and back sides of one display device, and further, to provide a light-emitting element that can have a function that is needed in each display portion. Typically, it is possible that a display is performed on a main display screen by using an active matrix light-emitting element and a display is performed on a sub display screen by using a passive matrix light-emitting element or a light-emitting element for area color. The sub display screen can be used as a light by making a whole display surface emit light. Further, one light-emitting element covers most of a non-light emission area of the other light-emitting element, and thus, the aperture ratio is much higher than a pixel formed by using a conventional light-emitting element. Therefore, contrast is enhanced and a high-definition display can be performed.

It should be noted that a light-emitting device in this specification includes a light-emitting device and an image display device that use a light-emitting element. Additionally, the followings are included in the light-emitting device: a module where a connector, for example, a flexible printed circuit (FPC), a tape automated bonding (TAB) tape, or a tape carrier package (TCP) is set up onto a light-emitting element; a module where a printed wiring board is set to the tip of a TAB tape or a TCP; and a module where integrated circuits (IC) or CPU are directly mounted on a light-emitting element by a chip on glass (COG) manner.

A light-emitting device of the present invention based on the scope of the present invention includes structures described below. A light-emitting device of the present invention comprises pixels which have a first light-emitting element and a second light-emitting element and which are arranged over a substrate in matrix form; wherein the first light-emitting element emits light in a first direction; the second light-emitting element emits light in a second direction that is opposite to the first direction; and a semiconductor element is electrically connected to a first electrode of the first light-emitting element.

Note that the semiconductor element and the second light-emitting element are formed between the first light-emitting element and the substrate. And the semiconductor element and the first light-emitting element may be formed between the second light-emitting element and the substrate.

A light-emitting device of the present invention comprises pixels which have a first light-emitting element, a second light-emitting element, and a semiconductor element electrically connected to a first electrode of the first light-emitting element and which are arranged over a substrate in matrix form; and an insulating film formed between the first light-emitting element and the second light-emitting element; wherein the first light-emitting element has a laminate structure in which the first electrode, a first light-emitting material containing layer, and a second electrode are formed sequentially from the substrate side; the second light-emitting element has a laminate structure in which a third electrode, a second light-emitting material containing layer, and a fourth electrode are formed sequentially from the substrate side; the semiconductor element and the second light-emitting element are formed between the first light-emitting element and the substrate; and the second and the third electrodes are each light-transparent.

Note that the first electrode and the fourth electrode may be each light-transparent and the insulating film may be colored. And the first electrode or the fourth electrode may be light-transparent and the insulating film may be colored.

A light-emitting device of the present invention comprises pixels which have a first light-emitting element, a second light-emitting element, and a semiconductor element electrically connected to a first electrode of the first light-emitting element and which are arranged over a substrate in matrix form; and an insulating film formed between the first light-emitting element and the second light-emitting element; wherein the first light-emitting element has a laminate structure in which the first electrode, a first light-emitting material containing layer, and a second electrode are formed sequentially from the substrate side; the second light-emitting element has a laminate structure in which a third electrode, a second light-emitting material containing layer, and a fourth electrode are formed sequentially from the substrate side; the semiconductor element and the first light-emitting element are formed between the second light-emitting element and the substrate; and the first and the fourth electrodes are each light-transparent.

Note that the second electrode and the third electrode may be each light-transparent and the insulating film may be colored. And the second electrode or the third electrode may be light-transparent and the insulating film may be colored.

The insulating film that is colored comprises organic resin that is dispersed with metal particles, carbon particles, or black pigment.

The first light-emitting element is an active matrix driving type and the second light-emitting element is a passive matrix driving type. Alternatively, the first light-emitting element may be an active matrix driving type and the second light-emitting element may be a light-emitting element for area color.

Further, the first light-emitting element or the second light-emitting element is a light-emitting element in which an organic compound emits light.

The semiconductor element is a thin film transistor, a MOS transistor, an organic transistor or a diode.

These and other objects, features and advantages of the present invention become more apparent upon reading of the following detailed description along with the accompanying drawings.

DETAILED DESCRIPTION OF THE INVENTION

Embodiment Modes

Embodiment modes of the present invention are described with reference to drawings hereinafter. Herein, a thin film transistor (TFT) is used as a pixel driving element and description thereof is made, but is not limited thereto particularly. For example, a semiconductor element such as a MOS transistor, an organic transistor, or a diode may be used similarly. A light-emitting element may be a light-emitting element that has a light-emitting layer including a light-emitting material between a pair of electrodes. An organic EL element using an organic compound as a light-emitting material or an inorganic EL element using an inorganic compound as a light-emitting material is given as an example thereof. An organic EL element is used as a light-emitting element and explained in Embodiment Modes below.

Embodiment Mode 1

Figure 1:
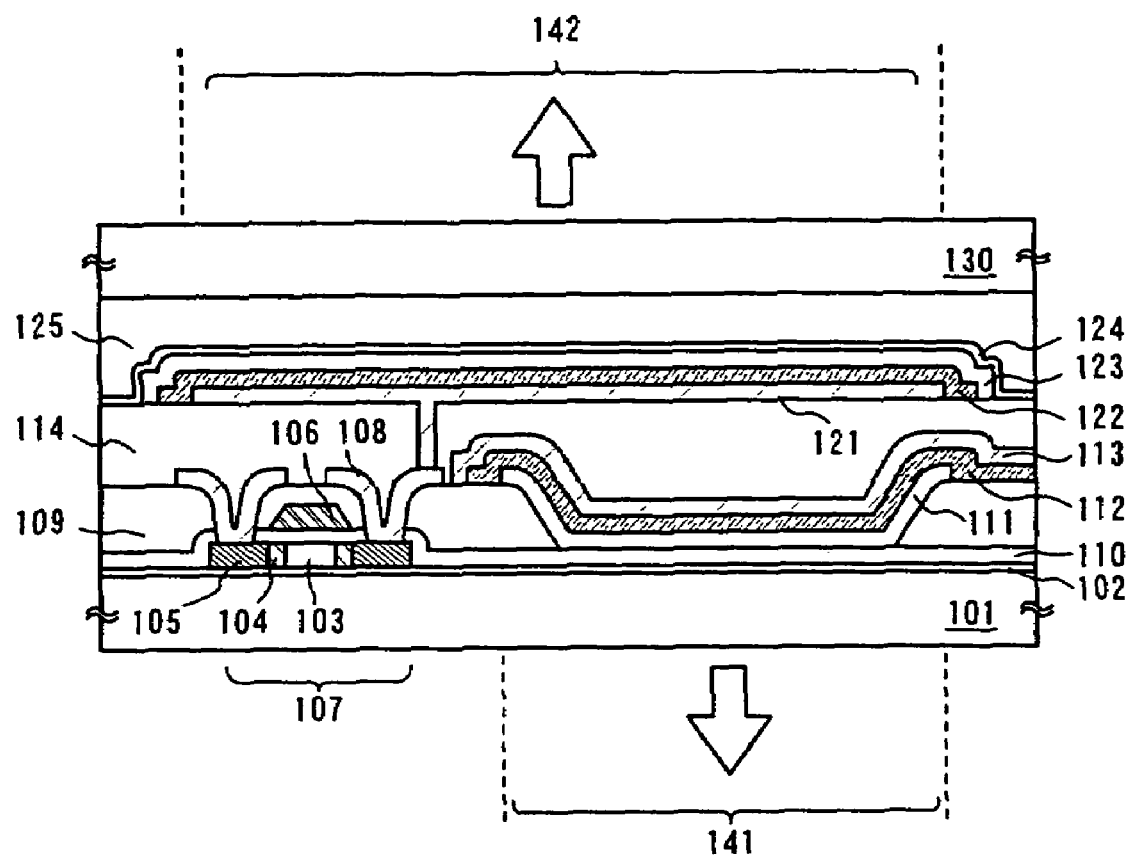
FIG. 1 shows a cross-section of a light-emitting device according to the present invention.

In this embodiment mode, a structure of a light-emitting device of the present invention is described with reference to FIG. 1. FIG. 1 is a cross sectional view of a pixel in a pixel portion of the light-emitting device. In FIG. 1, reference numeral 101 denotes a substrate, reference numerals 102, 109, and 114 denote insulating layers, reference numeral 107 denotes a TFT, reference numerals 111 and 121 denote first electrodes of respective electrodes, reference numerals 112 and 122 denote light-emitting material containing layers, reference numerals 113 and 123 denote second electrodes, reference numeral 124 denotes a transparent protective layer, reference numeral 125 denotes a sealing agent, reference numeral 130 denotes an opposite substrate, reference numeral 141 denotes a light-emitting region of a first light-emitting element, reference numeral 142 denotes a light-emitting region of a second light-emitting element.

The first light-emitting element is a light-emitting element in which a pixel driving element such as a passive matrix light-emitting element or a light-emitting element for area color is not provided, and emits light to the first substrate side (i.e. a bottom emission type light-emitting element). In this embodiment mode, a passive matrix light-emitting element is used as the first light-emitting element. Here, the first electrode 111 is a row electrode (an electrode extending perpendicularly to the paper) and the second electrode 113 is a column electrode (an electrode extending from the side to side of the paper). And the electrodes may be vice versa. On the contrary, a pixel driving element (TFT 107) is provided for the second light-emitting element and the second light-emitting element emits light to the second substrate side (i.e. a top emission type light-emitting element). Hereinafter, details of a structure of each light-emitting element is described.

The first light-emitting element includes the first electrode 111, the first light-emitting material containing layer 112, and the second electrode 113. In addition, the second light-emitting element includes the first electrode 121, the second light-emitting material containing layer 122 and the second electrode 123. The TFT 107 that is an element for controlling current flowing to the light-emitting material containing layer 112, is provided for the first electrode. Further, the first light-emitting element is insulated from the second light-emitting element with the third insulating layer 114 therebetween.

The first light-emitting element is formed over the substrate 101 with the insulating layer 102 therebetween. The combination of the insulating films between the first light-emitting element and the substrate is not limited to this and another light-transparent insulating film may be provided. In the first light-emitting element, light is emitted to the first electrode 111 side, and thus, when the first electrode is an anode, the electrode is formed from a transparent conductive material such as an indium oxide-tin oxide alloy (ITO), indium oxide-zinc oxide alloy (IZO), zinc oxide doped with gallium (GZO), ITO including silicon oxide. When the first electrode is a cathode, a light-transparent conductive material having a small work function is preferably used. A laminate structure of an ultra thin film including an alkali metal such as Li or Cs and an alkaline-earth metal such as Mg, Ca, or Sr and a transparent conductive film (such as ITO, IZO, ZnO, GZO, or ITO including silicon oxide) may be used for the cathode. Alternatively, the electron injecting layer is formed by co-evaporation of an alkali metal or an alkaline-earth metal and an electron transport material, and a transparent conductive film (such as ITO, IZO, ZnO, GZO, or ITO including silicon oxide) may be laminated thereover.

The first light-emitting material containing layer 112 is formed by vapor deposition, spin coating or an application method such as ink-jetting. When the light-emitting material is a low-molecular-weight material, vapor deposition is mainly employed. In the case of using a high-molecular-weight, or a middle-molecular-weight such as oligomer or dendrimer as the light-emitting material, an application method is mainly employed. Here, the light-emitting material containing layer 112 is formed in a vapor deposition apparatus, and an uniform film is obtained. For the purpose of enhancing the reliability, just before forming the light-emitting material containing layer 112, cleaning by UV radiation or vacuum heating (from 100° C. to 250° C.) for deaerating is preferably performed. In addition, details of the structure of the first light-emitting material containing layer 112 are described in Embodiment Mode 4.

The second electrode 113 has reverse polarity of the first electrode 111, and has light-shielding effect. For example, when the first electrode 111 is an anode, the second electrode is a cathode, and the cathode can be formed by using a rare-earth metal such as Yb or Er, as well as an alkali metal such as Li or Cs, an alkaline-earth metal such as Mg, Ca, or Sr and an alloy including them (Mg:Ag, Al:Li, or the like). In addition, when the electron injecting layer made of LiF, CsF, $CaF_2$, $Li_2O$ or the like is employed, a conventional conductive thin film such as aluminum can be used. Further, when the first electrode 111 is a cathode, the second electrode is an anode. And the anode may be formed from a laminated layer of a titanium nitride film and a film mainly containing aluminum, and a three-layer structure of a titanium nitride film, a film mainly containing aluminum, and a titanium nitride film, as well as a single layer of a film made of TiN, ZrN, TI, W, Ni, Pt, Cr, Al, or the like.

An interlayer insulating film 114 made of an organic material or an inorganic material is formed as the third insulating layer 114 for insulating the first light-emitting element from the second light-emitting element. For the interlayer insulating film 114, an inorganic material (such as silicon oxide, silicon nitride or silicon oxynitride), a photosensitive or a non-photosensitive organic material (such as polyimide, acryl, polyamide, polyimidamide, resist, benzocyclobutene or siloxane) or a laminate thereof can be used. In this embodiment mode, non-photosensitive organic resin is used as the third insulating layer. However, only a top edge portion of the insulating film may have a curved surface having a curvature radius by using a positive type photosensitive acryl as an organic resin material like reference numeral 109 as shown in FIG. 1. Both a negative type resin that is insoluble in etchant by light and a positive type resin that is soluble in etchant by light can be used as the insulating film.

The second light-emitting element includes the first electrode 121, the second light-emitting material containing layer 122 and the second electrode 123, and light is emitted to the second electrode 123 side. Thus, when the TFT 107 is a p-channel TFT, the first electrode 121 is an anode and the second electrode 123 is a cathode. The second electrode is preferably made of a light-transparent conductive material having a small function. A laminate structure of an ultra thin film including an alkali metal such as Li or Cs and an alkaline-earth metal such as Mg, Ca, or Sr and a transparent conductive film (such as ITO, IZO, ZnO, GZO, or ITO including silicon oxide) may be used for the cathode. Alternatively, the electron injecting layer is formed by co-evaporation of an alkali metal or an alkaline-earth metal and an electron transport material, and a transparent conductive film (such as ITO, IZO, ZnO, GZO, or ITO including silicon oxide) may be laminated thereover. On the other hand, when the TFT 107 is an n-channel TFT, the first electrode 121 is a cathode and the second electrode 123 is an anode. And the anode may be formed from a transparent conductive material such as an indium oxide-tin oxide alloy (ITO), indium oxide-zinc oxide alloy (IZO), zinc oxide doped with gallium (GZO), ITO including silicon oxide or the like. It should be noted that the first electrode has reverse polarity of the second electrode 121 and is formed from a material having each polarity, just like the second electrode of the first light-emitting element.

The second light-emitting material containing layer 122 is formed in the similar manner as the first light-emitting material containing layer 112. Note that details of the second light-emitting material containing layer 122 are described in Embodiment Mode 4.

The TFT is formed over the substrate 101 with the insulating layer 102 therebetween, and includes a semiconductor region having a channel forming region 103, a low concentration impurity region 104 and a high concentration impurity region 105 (a source region or a drain region), a gate insulating film 110 provided between the semiconductor region and a gate electrode, the gate electrode 106 and a drain electrode (or source electrode) 108.

The interlayer insulating film 109 made of an organic material or an inorganic material is formed between the semiconductor region and the drain electrode (or source electrode) 108. The same material as the third insulating layer can be used as the interlayer insulating film 109. Note that the insulating film 109 has a curved surface having a curvature radius on only the top edge portion of the insulating film by using a positive type photosensitive acryl as an organic resin material like reference numeral 109 as shown in FIG. 1.

Although not shown here, one or plural TFTs (n-channel TFT or p-channel TFT) is/are provided for one second light-emitting element. Although the TFT having one channel forming region 103 is shown here, the TFT is not limited thereto and a TFT having the channel forming region 103 and the high concentration impurity region (source region and drain region) 105 may be used.

The semiconductor region 103 is an amorphous semiconductor region or a crystalline semiconductor region. As the material of the semiconductor region, an element or an alloy of semiconductor elements (such as silicon and germanium), an organic semiconductor material or the like can be used. The organic semiconductor material is the organic compound which shows semiconductor electrical properties of the specific resistance of about from $10^{-2}$ Ωcm to $10^{16}$ Ωcm, and the structure is preferably a high-molecular-weight material of the n electron conjugate system in which the skeleton is made up of conjugated double bond. Concretely, a soluble high-molecular-weight material such as polythiophene, poly (3-alkylthiophene) or a polythiophene derivative is preferable. For the substrate and the opposite substrate, a non-alkaline glass substrate such as alumino borosilicate glass, barium borosilicate glass, aluminosilicate glass, or a plastic substrate such as PET (polyethylene terephthalate), PEN (polyethylenenaphthalate), PES (a polyeter sulfide), polypropylene, polypropylene sulfide, polycarbonate, polyetherimide, polyphenylene sulfide, polyphenylene oxide, polysulfone or polyphthalamide can be used.

The transparent protective layer 124 is formed over a surface of the second electrode 123 of the second light-emitting element. A silicon nitride film, a silicon oxide film, a silicon oxynitride film (SiNO film (composition ratio N>O) or SiON film (composition ratio N<O)), or a thin film mainly containing carbon (e.g. DLC film, CN film) obtained by sputtering or CVD can be used for the transparent protective layer 124. The transparent protective layer 124 protects the second electrode 123 made of a thin metal film and also serves as a sealing film that can block moisture.

The substrate 101 in which the first and the second light-emitting elements are formed is attached to the opposite substrate 130 by the sealing agent 125. The sealing agent includes a gap material for securing the space between the substrates and is arranged so as to surround the pixel portion.

In this embodiment mode, the first electrode 121 of the second light-emitting element covers the light-emitting region 141 of the first light-emitting element that is passive matrix type. Therefore, the total of the light-emitting region in a pixel is the total of the areas of the light-emitting regions 141 and 142 of the two light-emitting elements. Accordingly the aperture ratio can be increased according to the present invention, although the aperture ratio of a conventional light-emitting element is only that of the light-emitting region of the first light-emitting element or the second light-emitting element.

Embodiment Mode 2

A structure different from that of Embodiment Mode 1 is described with reference to FIG. 2 in this embodiment mode, as for a light-emitting device having plural light-emitting elements in a pixel. The same elements as those in FIG. 1 are shown by the same reference numerals and the description thereof is omitted.

Figure 2:
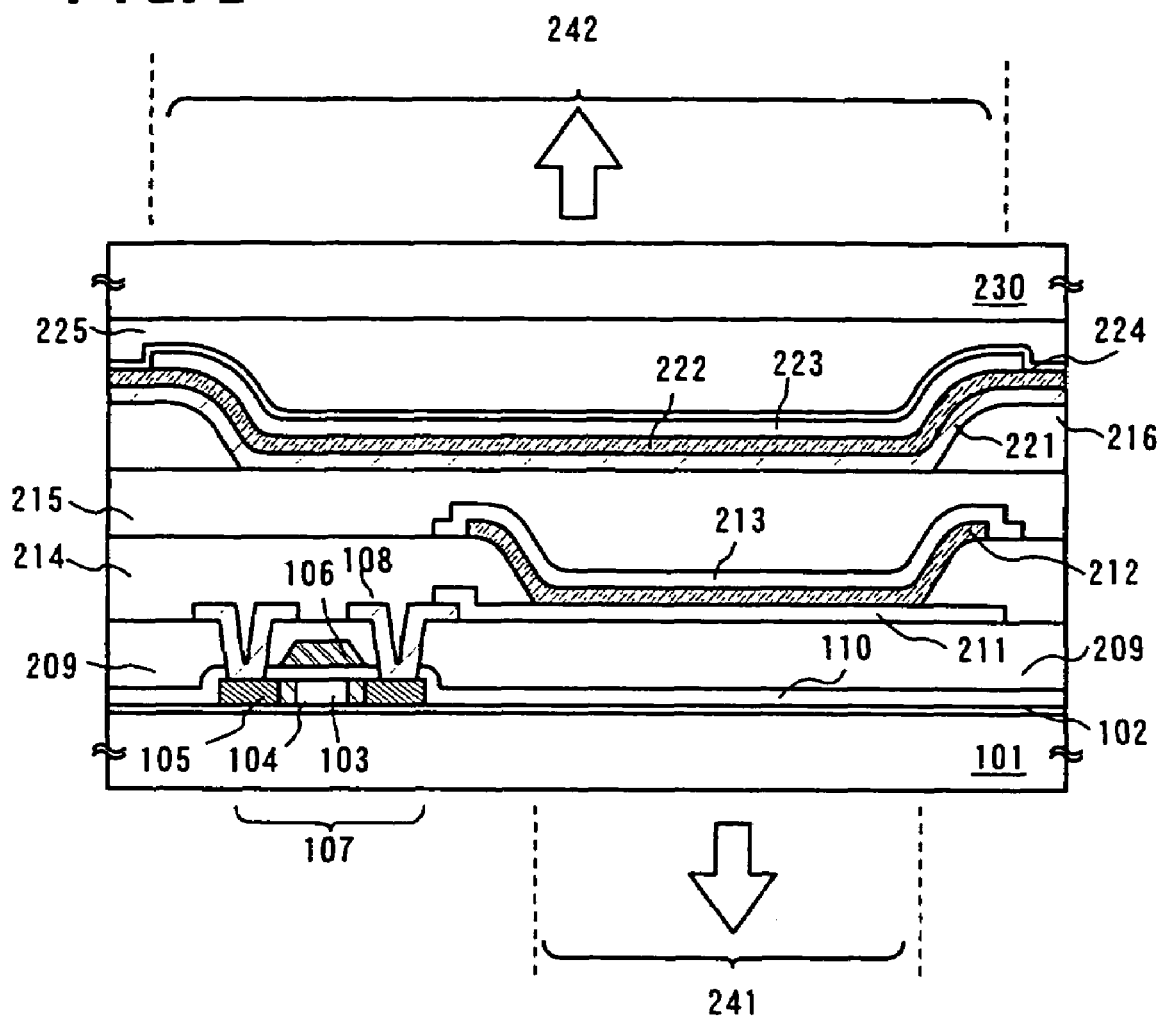
FIG. 2 shows a cross-section of a light-emitting device according to the present invention.

FIG. 2 is a cross sectional view of a pixel in a pixel portion of the light-emitting device. In FIG. 2, reference numeral 101 denotes a first substrate, reference numerals 102, 209, 214, 215 and 216 denote insulating layers, reference numeral 107 denotes a TFT, reference numerals 211 and 221 denote first electrodes of respective light-emitting elements, reference numeral 212 and 222 denote light-emitting material containing layers of respective light-emitting elements, reference numeral 213 and 223 denote second electrodes of respective light-emitting elements, reference numeral 224 denotes a transparent protective layer, reference numeral 225 denotes a sealing agent, reference numeral 230 denotes an opposite substrate, reference numeral 241 denotes a light-emitting region of a first light-emitting element, reference numeral 242 denotes a light-emitting region of a second light-emitting element.

In this embodiment mode, the TFT 107 that is a pixel driving element is provided for the first light-emitting element and the first light-emitting element emits light to the first substrate side (i.e. a bottom emission type light-emitting element). On the contrary, the second light-emitting element is a light-emitting element in which a pixel driving element such as a passive matrix light-emitting element or a light-emitting element for area color is not provided and emits light to the second substrate side (i.e. a top emission type light-emitting element). In this embodiment mode, a passive matrix light-emitting element is used as the second light-emitting element. Here, the first electrode is a column electrode (an electrode extending from the side to side of the paper) and the second electrode is a row electrode (an electrode extending perpendicularly to the paper). And the electrodes may be vice versa. Hereinafter, details of a structure of each light-emitting element are described.

The first light-emitting element includes the first electrode 211, the first light-emitting material containing layer 212, and the second electrode 213. The TFT 107 that is an element for controlling current flowing to the light-emitting material containing layer 212 is provided for the first electrode of the second light-emitting element. In addition, the first light-emitting material containing layer 212 is formed over the first electrode 211 and the third insulating layer 214. The third insulating layer 214 is an insulating layer for covering edge portions of the first electrode 211, the second insulating layer 209 and the drain electrode (or source electrode) 108 and is referred to as a bank, a partition wall, a barrier or a mound.

The second light-emitting element includes the first electrode 221, the second light-emitting material containing layer 222 and the second electrode 223. Further, the first light-emitting element is insulated from the second light-emitting element with the fourth insulating layer 215 therebetween.

Firstly, the first light-emitting element is described. The first light-emitting element is formed over the substrate 101 with plural insulating layers (the first insulating layer 102, the gate insulating film 110, the second insulating layer 209) therebetween. In the first light-emitting element, light is emitted to the first electrode 211 side. Therefore, when the TFT 107 is p-channel, the first electrode 211 is an anode and is formed from the same material as the anode that is the first electrode of the first light-emitting element in Embodiment Mode 1. On the contrary, when the TFT 107 is n-channel, the first electrode 211 is a cathode and is formed from the same material as the cathode that is the first electrode of the first light-emitting element in Embodiment Mode 1. The first light-emitting material containing layer 212 and the second electrode 213 are formed by using the same material as those (112 and 113, respectively) of the first light-emitting element in Embodiment Mode 1.

The pixel driving element TFT 107 that is connected to the first electrode 211 of the first light-emitting element is formed from the same material as that in Embodiment Mode 1. In this embodiment mode, the first electrode 211 is formed after the drain electrode (or source electrode) 108 of the TFT 107 is formed, but is not limited to this. For example, after forming the first electrode 211, the drain electrode (or source electrode) 108 of the FTT 107 may be formed and the drain electrode (or source electrode) 108 of the TFT 107 and the first electrode 211 may be formed from the same material at the same time.

The interlayer insulating film 209 made of an organic material or an inorganic material is formed between the semiconductor region and the drain electrode (or source electrode) 108. The same material as the third insulating layer 114 in Embodiment Mode 1 can be used as the interlayer insulating film 209. Note that the insulating film 209 does not a curved surface having a curvature radius on the top edge portion of the insulating film, because of using non-photosensitive acryl as an organic resin material in this embodiment mode, different from reference numeral 109 as shown in FIG. 1.

The first light-emitting material containing layer 212 is formed in the similar manner as the first light-emitting material containing layer 112 of the first light-emitting element described in Embodiment Mode 1. Details of the second light-emitting material containing layer 222 are described in Embodiment Mode 4.

The second electrode has reverse polarity of the first electrode 211, and is formed from the same material as the second electrode of the first light-emitting element described in Embodiment Mode 1.

The interlayer insulating film 215 made of an organic material or an inorganic material is formed as the fourth insulating layer 215 for insulating the first light-emitting element from the second light-emitting element. The interlayer insulating film 215 is formed from the same material as the third interlayer insulating layer 114 in Embodiment Mode 1.

The second light-emitting element includes the first electrode 221, the second light-emitting material containing layer 222 and the second electrode 223, and light is emitted to the second electrode 223 side. Thus, the second electrode 223 is formed from the same material as the second electrode 123 of the second light-emitting element in Embodiment Mode 1. Further, the first electrode 221 and the second light-emitting material containing layer 222 are formed in a similar way as the first electrode 121 and the second light-emitting material containing layer 122 in Embodiment Mode 1. The first electrode 223 is formed from the same material as the first electrode 121 of the second light-emitting element in Embodiment Mode 1.

In this embodiment mode, the first electrode 221 of the second light-emitting element covers the light-emitting region 241 of the first light-emitting element that is active matrix type. Therefore, the total of the light-emitting regions in a pixel is the total of the areas of the light-emitting regions 241 and 242 of the two light-emitting elements. Accordingly the aperture ratio can be more increased than that of a pixel of a light-emitting device using a conventional light-emitting element.

Embodiment Mode 3

This embodiment mode describes a display device in which all electrodes of a first light-emitting element and a second light-emitting element are light-transparent in Embodiment Mode 1 or 2, and the interlayer insulating layer that insulates the first light-emitting element from the second light-emitting element is colored, preferably formed from a material that does not transmit visible light substantially. The light-emitting device described in Embodiment Mode 1 is described as an example of a structure of a light-emitting device in this embodiment mode.

The first electrodes and the second electrodes of the first light-emitting element and the second light-emitting element are made of light-transparent conductive films. When the first electrode is an anode, the electrode may be formed from a transparent conductive material such as an indium oxide-tin oxide alloy (ITO), indium oxide-zinc oxide alloy (IZO), GZO, ITO including silicon oxide or the like. In this case, the second electrode is a cathode, and a light-transparent conductive material having a small work function is preferably used. A laminate structure of an ultra thin film including an alkali metal such as Li or Cs and an alkaline-earth metal such as Mg, Ca, or Sr and a transparent conductive film (such as ITO, IZO, ZnO, GZO, or ITO including silicon oxide) may be used for the cathode. Alternatively, an electron injecting layer is formed by co-evaporation of an alkali metal or an alkaline-earth metal and an electron transport material, and a transparent conductive film (such as ITO, IZO, ZnO, GZO, or ITO including silicon oxide) may be laminated thereover. Further, when the first electrode is a cathode and the second electrode is an anode, light-transparent electrode materials for having each polarity may be appropriately used for the electrodes, similarly.

In this case, light emitted in one light-emitting element is also emitted to the other light-emitting element side and display images are overlapped with each other on each display screen. The interlayer insulating layers (114 in FIGS. 1 and 215 in FIG. 2) for insulating each light-emitting element are formed from a colored material, preferably a material that does not reflect and transmit visible light substantially. A metal film (such as chrome), carbon particles, or an insulating film including black pigment (preferably, an organic resin film) is cited as the material of the interlayer insulating layer.

The structure of this embodiment mode can prevent reflection of an outside sight (a state that an image is reflected off each electrode having reflectiveness and an outside image is reflected and appears on a display screen (a screen facing an observer)) generated in the case of using a material having reflectiveness as the electrode having light-shielding effect (for example, the second electrode of the first light-emitting element, the first electrode of the second light-emitting element or the like). Therefore, an expensive circularly polarizing film is not needed and loss of emitted light due to a circularly polarizing film does not occur, and thus, an inexpensive light-emitting device that can provide favorable image quality can be obtained.

Note that the second electrode of the first light-emitting element may be an electrode having light-shielding effect and the first electrode of the second light-emitting element may be a light-transparent electrode, and the interlayer insulating layer may be formed from a colored material, preferably a material that does not reflect and transmit visible light substantially. In this case, when the second electrode of the first light-emitting element is made of a conductive film having reflectiveness, reflection is generated. However, when a display screen formed by using the first light-emitting element is a sub display screen, influence of the reflection is comparatively small.

Embodiment Mode 4

Figure 3A:
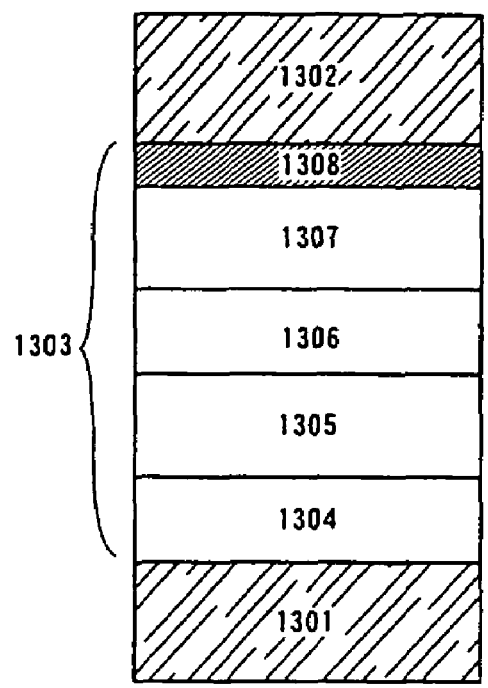
FIGS. 3A and 3B each show light-emitting elements according to the present invention.
Figure 3B:
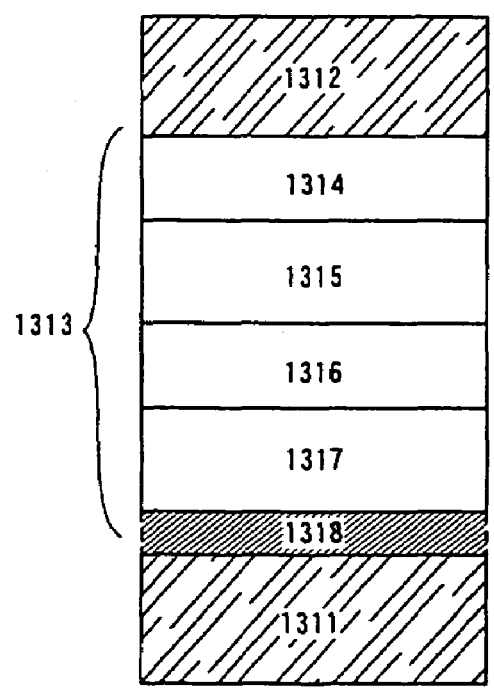

This embodiment mode describes a structure of a light-emitting material containing layer (112 and 122 in Embodiment Mode 1 and 212 and 222 in Embodiment Mode 2) of a light-emitting element which can be applied in Embodiment Modes 1 to 3 with reference to FIGS. 3A and 3B.

The light-emitting element comprises a pair of an anode and a cathode, and a light-emitting material containing layer sandwiched with the anode and the cathode. Hereinafter, an electrode formed on a substrate side is referred to as a first electrode, and an electrode formed on the opposite side of the substrate is referred to as a second electrode.

The light-emitting material containing layer includes at least a light-emitting layer, and is formed from any one of a hole injecting layer, a hole transporting layer, a blocking layer, an electron transporting layer and an electron injecting layer that each have different functions for carriers, or by combining plural layers thereof and laminating them.

FIGS. 3A and 3B each show an example of a cross sectional structure of the light-emitting element.

In FIG. 3A, a hole injecting layer 1304, a hole transporting layer 1305, a light-emitting layer 1306, an electron transporting layer 1307 and an electron injecting layer 1308 are laminated in a light-emitting material containing layer 1303 over a first electrode (anode) 1301, and a second electrode (cathode) 1302 is provided to be in contact with the electron injecting layer 1308. This structure is, herein, referred to as a sequence laminate type element.

Further, in FIG. 3B, an electron injecting layer 1318, an electron transporting layer 1317, a light-emitting layer 1316, a hole transporting layer 1315, and a hole injecting layer 1314 are laminated in a light-emitting substance containing layer 1313 over a first electrode (cathode) 1311, and a second electrode (anode) 1312 is provided to be in contact with the hole injecting layer 1314. This structure is, herein, referred to as a reverse laminate type element.

In this embodiment mode, the first light-emitting element and the second light-emitting element can employ either the structure of FIG. 3A or that of FIG. 3B. Both the first light-emitting element and the second light-emitting element may employ the sequence laminate type element or the reverse laminate type element, or one light-emitting element may be the sequence laminate type element and the other light-emitting element may be the reverse laminate type element. The former sequence laminate type element is desirable for the light-emitting elements shown in Embodiment Modes 1 and 2.

Note that this embodiment mode is not limited to this. Various kinds of light-emitting element structures, e.g., an anode/a hole injecting layer/a light-emitting layer/an electron transporting layer/a cathode, an anode/a hole injecting layer/a hole transporting layer/a light-emitting layer/an electron transporting layer/an electron injecting layer/a cathode, an anode/a hole injecting layer/a hole transporting layer/a light-emitting layer/a hole blocking layer/an electron transporting layer/a cathode, an anode/a hole injecting layer/a hole transporting layer/a light-emitting layer /a hole blocking layer/an electron transporting layer/an electron injecting layer/a cathode and the like can be employed. Note that a stripe arrangement, a delta arrangement, a mosaic arrangement and the like can be cited as the arrangement of a light-emitting region, that is to say, the arrangement of a pixel electrode.

Known organic compounds of a low-molecular-weight, a high-molecular-weight, or a middle-molecular-weight typified by oligomer and dendrimer can be used as the material for forming the light-emitting material containing layers 1303 and 1313. Further, a light-emitting material (fluorescent material, singlet compound) that emits light (fluorescence) by singlet excitation or a light-emitting material (phosphorescent material, triplet compound) that emits light (phosphorescence) by triplet excitation can be used.

Concrete examples of the materials for forming the light-emitting material containing layers 1303 and 1313 are shown below.

A porphyrin system compound is effective as a hole injecting material for forming the hole injecting layers 1304 and 1314 in the case of an organic compound, and for example, phthalocyamine (hereinafter referred to as $H_2$-Pc), copper phthalocyamine (hereinafter referred to as Cu—Pc), or the like can be used. A material in which chemical doping is performed on a conductive high-molecular-weight (polymeric) compound can also be used, and polyethylene dioxythiophene (hereinafter referred to as PEDOT) doped with polystyrene sulfonate (hereinafter referred to as PSS), polyaniline, polyvinyl carbazole (hereinafter referred to as PVK), and the like can be given as the examples. Further, an inorganic semiconductor thin film such as vanadium pentoxide or molybdenum oxide, or an ultra thin film of an inorganic insulator such as aluminum oxide is also effective.

As the hole transporting material used for forming the hole transporting layers 1305 and 1315, an aromatic amine-based (that is, compound having a benzene ring-nitrogen bond) compound is preferred. As the material that is used widely, for example, N,N'-bis (3-methylphenyl)-N,N'-diphenyl-1,1'-biphenyl-4,4'-diamine (TPD); a derivative thereof such as 4,4'-bis[N-(1-naphthyl)-N-phenyl-amino]-biphenyl (α-NPD) and the like are cited. Alternatively, star burst aromatic amine compounds such as 4, 4', 4"-tris (N,N-diphenyl-amino)-triphenylamine (TDATA) and 4, 4', 4"-tris [N-(3-methylphenyl)N-phenyl-amino]-triphenylamine (MTDATA) can be also used.

Specific examples of the light-emitting material used for forming the light-emitting layers 1306 and 1316 include metal complexes such as tris (8-quinolinolato) aluminum (hereinafter, referred to as $Alq_3$), tris (4-methyl-8-quinolinolato) aluminium (hereinafter, referred to as $Almq_3$), bis (10-hydroxybenzo [h]-quinolinate) beryllium (hereinafter, referred to as $BeBq_2$), and bis (2-methyl-8-quinolinolato)-(4-hydroxy-biphenylyl)-aluminum (hereinafter, referred to as BAlq), bis [2-(2-hydroxyphenyl)-benzooxazolate] zinc (hereinafter, referred to as $Zn(BOX)_2$) and bis [2-(2-hydroxyphenyl)-benzothiazolate] zinc (hereinafter, $Zn(BTZ)_2$). In addition, various fluorescent dyes are also effective for the material of the light-emitting layers. Triplet light-emitting materials may be also used and main examples thereof include complexes with platinum or iridium as the central metal. Known triplet light-emitting materials include tris (2-phenylpyridine) iridium (hereinafter, referred to as Ir(ppy)$_3$), 2, 3, 7, 8, 12, 13, 17, 18-octaethyl-21H, 23H-porphyrin-platinum (PtOEP) and the like.

Metal complexes are often used as the electron transport material for forming the electron transporting layers 1307 and 1317. Preferred examples of the metal complex include tris (8-quinolinolato) aluminum (Alq$_3$), tris (4-methyl-8-quinolinolato) aluminium (Almq$_3$), and bis (10-hydroxybenzo [h]-quinolinate) beryllium (BeBq$_2$), bis (2-methyl-8-quinolinolato)-(4-hydroxy-biphenylyl)-aluminum (BAlq), bis [2-(2-hydroxyphenyl)-benzooxazolate] zinc (Zn(BOX)$_2$) and bis [2-(2-hydroxyphenyl)-benzothiazolate] zinc (Zn(BTZ)$_2$). Other materials that are capable of transporting electrons in addition to the metal complexes are oxadiazole derivatives such as 2-(4-biphenyl)-5-(4-tert-butylphenyl)-1,3,4-oxadiazole (PBD), and 1,3-bis [5-(p-tert-butylphenyl)-1,3,4-oxadiazole-2-yl] benzene (OXD-7), triazole derivatives such as 3-(4-tert-butylphenyl)-4-phenyl-5-(4-biphenylyl)-1, 2, 4-triazole (TAZ) and 3-(4-tert-butylphenyl)-4-(4-ethylphenyl)-5-(4-biphenylyl)-1, 2, 4-triazole (p-EtTAZ), an imidazole derivative such as 2,2',2"-(1,3,5-benzenetriyl)tris[1-phenyl-1H-benzimidazole (TPBI) and phenanthroline derivatives such as bathophenanthroline (BPhen) and bathocuproin (BCP).

As the electron injecting material to be used for forming electron injecting layers 1308 and 1318, the above described electron transporting materials can be used. Besides, an ultra thin film of an insulator, for example, an alkaline metal halogenated compound such as LiF or CsF, an alkaline earth halogenated compound such as CaF$_2$, or an alkaline metal oxide such as Li$_2$O is often used. In addition, an alkaline metal complexe such as lithium acetylacetonate (Li(acac)), or 8-quinolinolato-lithium (Liq) can also be used effectively.

The light-emitting material containing layer of the light-emitting element shown in any one of Embodiment Modes 1 to 3 can be formed by appropriately selecting the above described structure and material.

When the light-emitting device of this embodiment mode is a full color display, the material layers which each emit red, green, and blue light can be deposited as the light-emitting substance containing layers 1303 and 1313 using a vapor-deposition mask, respectively. Instead of this method, spin coating, or ink-jetting can be appropriately employed for the film formation selectively.

In addition, the light-emitting material containing layer is a white light-emitting layer and a full color may be displayed by providing a color filter separately. Alternatively, the light-emitting material containing layer is a blue light-emitting layer and a full color may be displayed by providing a color conversion layer or the like separately.

Embodiment Mode 5

Next a driving method of the light-emitting devices of the present invention shown in Embodiment Modes 1 to 4 is described below.

In this embodiment mode, because it is difficult to distinguish between a source region and a drain region of a TFT depending on the structure or an operating condition, one electrode is referred to as a first electrode and the other is referred to as a second electrode. In addition, a first light-emitting element is a bottom emission type light-emitting element and a second light-emitting element is a top emission type light-emitting element. Regions where emitted light can be obtained are each a first region and a second region and the both regions are included in a repetition unit one by one.

Figure 8:
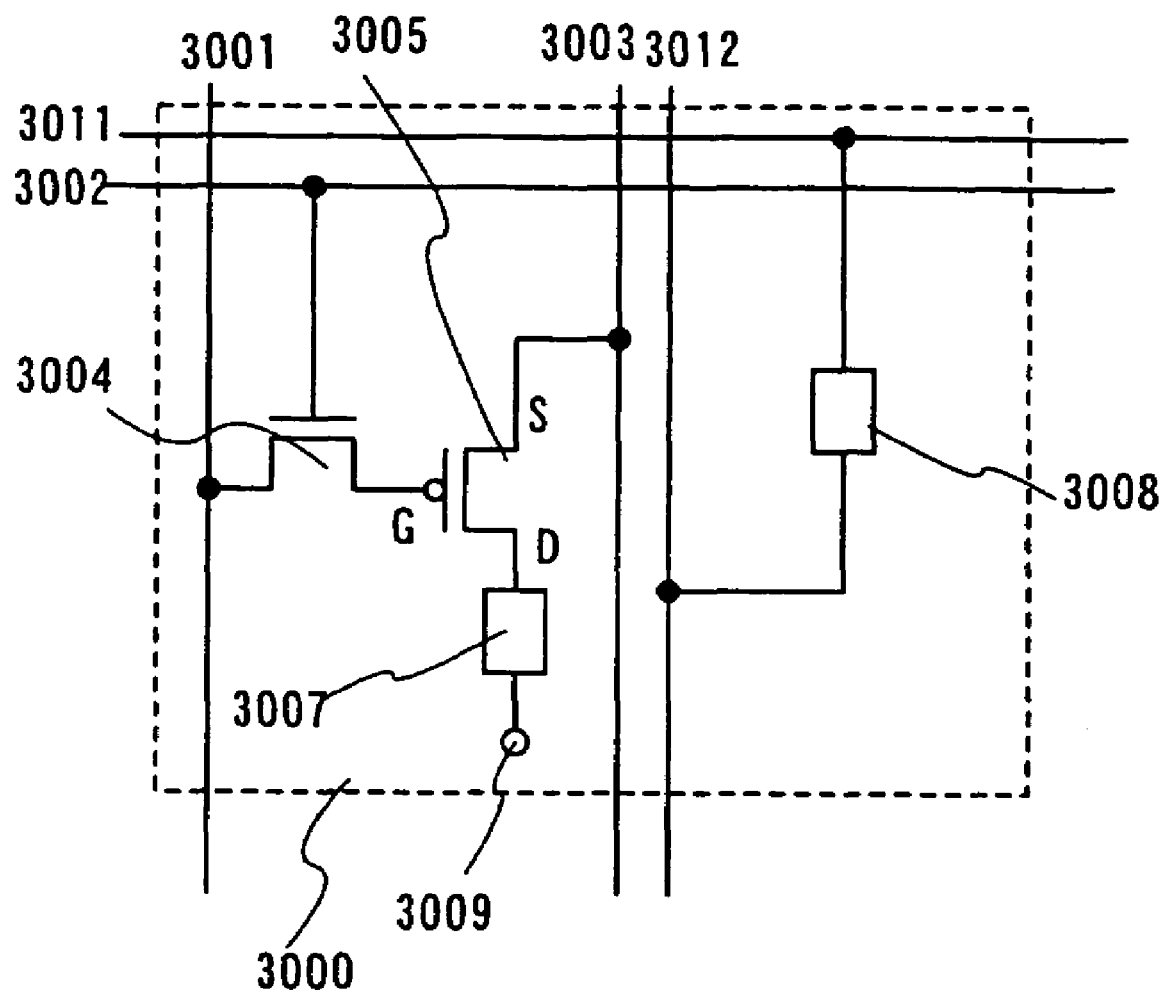
FIG. 8 shows a driving method of a light-emitting device according to the present invention.

An example of this embodiment mode is shown in FIG. 8. This embodiment mode shows an example in which light emission or non-light emission of a second light-emitting element 3007 is controlled by first and second driving TFTs 3004 and 3005.

The region surrounded by a dotted line frame 3000 is a repetition unit of a light-emitting device. The second light-emitting element 3007, a source signal line 3001 of the second light-emitting element, a gate signal line 3002 and a power supply line (a wiring for supplying constant voltage or constant current) 3003, a switching TFT 3004 and a driving TFT 3005 of the second light-emitting element, a first light-emitting element 3008, a row electrode signal line 3011 and a column electrode signal line 3012 of the first light-emitting element are included therein.

A gate electrode of the switching TFT 3004 of the second light-emitting element is connected to the gate signal line 3002 electrically, the first electrode is connected to the source signal line 3001 electrically, and the second electrode is connected to a gate electrode of the driving TFT 3005 electrically. The first electrode of the driving TFT 3005 is connected to the power supply line (a wiring for supplying constant voltage or constant current) 3003 electrically and the second electrode is connected to the first electrode of the second light-emitting element 3007 electrically.

On the contrary, the row electrode signal line 3011 is the first electrode of the first light-emitting element and the column electrode signal line 3012 is the second electrode of the first light-emitting element.

A video signal which has been input into the source signal line 3001 is input to the gate electrode of the driving TFT 3005 at the timing when the switching TFT 3004 turns ON, and current is supplied to the second light-emitting element 3007 to emit light depending on the video signal. The first light-emitting element emits light when the row electrode signal line 3011 and the column electrode signal line 3012 turn ON. As described above, the first region and the second region can allow light to be emitted from the both front and back sides of the substrate.

When the first light-emitting element is a light-emitting element for area color, the power supply line (a wiring for supplying constant voltage or constant current) 3003 and the column electrode are common, and ON and OFF of the first light-emitting element may be controlled by the row electrode. Further, the example in which the driving TFT for controlling light-emission and non-light-emission of the second light-emitting element is provided in a pixel is shown, but is not limited to this structure and may be provided outside the pixel portion (in the peripheral portion). Further, an external IC chip or the like may be used.

By the above-mentioned driving methods, different images can be displayed in the first region and the second region, in other words, in the front and back sides of a light-emitting device simultaneously. Accordingly, a light-emitting device in which each display screen has a light-emitting element that is suitable for a required display content, can be manufactured.

EMBODIMENTS

Embodiment 1

This embodiment describes manufacturing steps of a light-emitting element having the structure of Embodiment Mode 1 with reference to FIGS. 4A, 4B, 5A, 5B, 6A, 6B and 7.

Figure 4A:
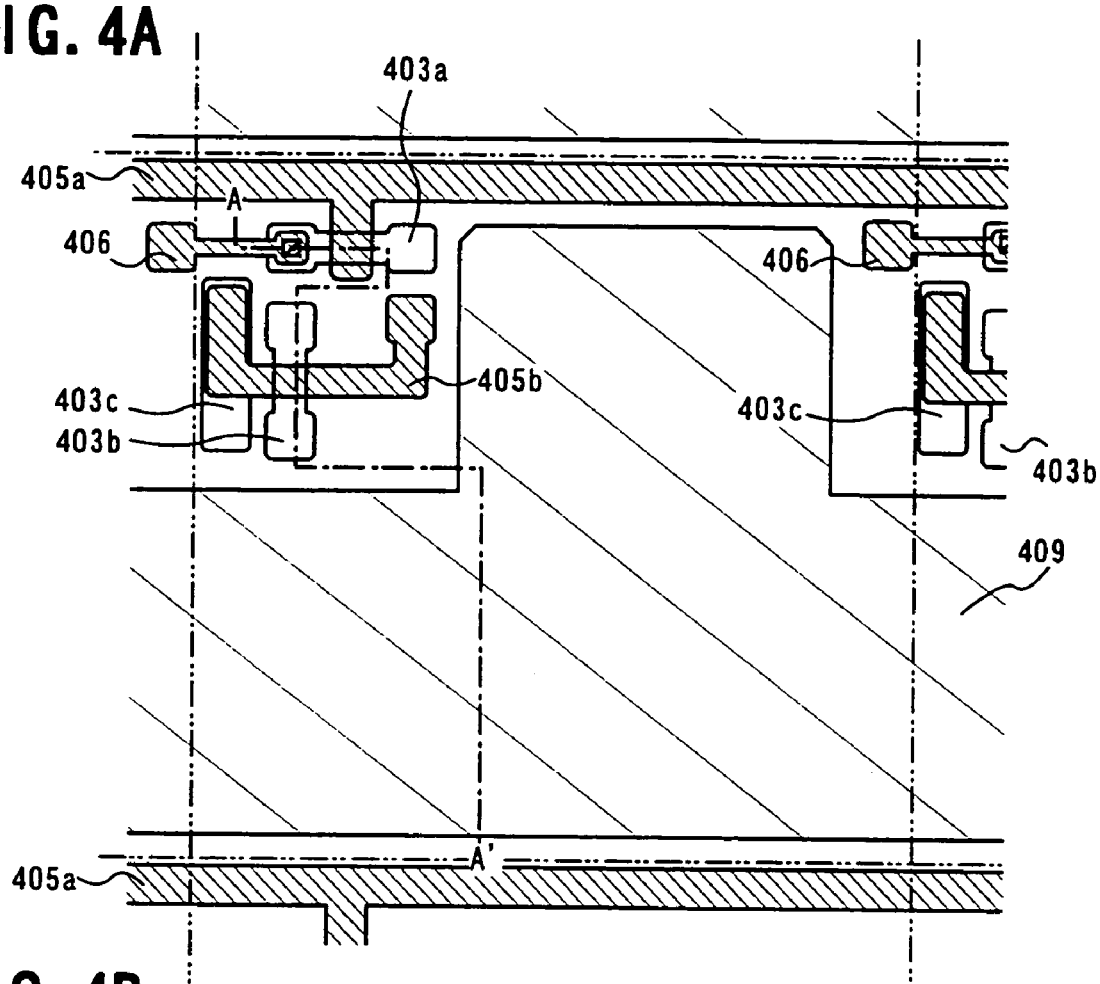
FIGS. 4A and 4B each show steps of manufacturing a light-emitting device according to the present invention.
Figure 4B:
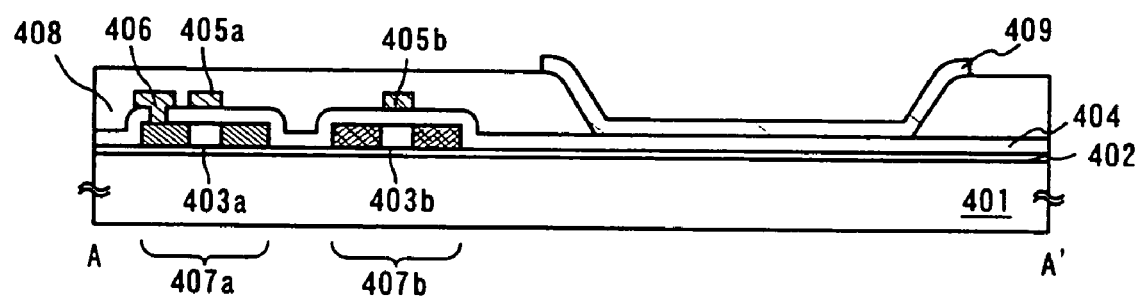

FIGS. 4A and 4B show steps of forming a first electrode of a first light-emitting element and a part of TFTs of a second light-emitting element. FIG. 4A is a top view and FIG. 4B is a cross-sectional view taken along A-A' in FIG. 4A.

As shown in FIG. 4A, a base insulating film 402 is formed over a glass substrate (a first substrate 401). In this embodiment, the base insulating film has a two-layer structure in which a first silicon oxynitride film is formed to be from 50 nm to 100 nm thick by using $SiH_4$, $NH_3$, and $N_2O$ as reactive gases, and a second silicon oxynitride film is formed thereon to be from 100 nm to 150 nm thick by using $SiH_4$ and $N_2O$ as reactive gases.

An amorphous silicon film is formed over the base insulating film by a known method such as plasma CVD, reduced pressure CVD, or sputtering, and a heat treatment is performed to crystallize it. At this time, silicide is formed in portions of a semiconductor film that are in contact with a metal element for promoting crystallization of the semiconductor and crystallization progresses with the silicide as a nucleus. Herein, a heat treatment for crystallization (from 550° C. to 650° C., for 4 to 24 hours) is preformed after a heat treatment (450° C., for one hour) for dehydrogenation.

Thereafter, the metal element in a crystalline silicon film is removed or the concentration thereof is reduced by gettering the metal element from the crystalline silicon film by a known method. Next, the crystalline silicon film is preferably irradiated with laser light for repairing defects left in crystal grains and increasing the degree of crystallinity (the proportion of crystalline component in the volume of a whole film).

Next, a TFT is formed by a known method using the crystalline silicon film. The crystalline silicon film is etched to have a desired shape and thus, semiconductor regions 403a, 403b, and 403c are formed. The reference numeral 403a denotes a semiconductor region of the switching TFT of the second light-emitting element, the reference numeral 403b denotes a semiconductor region of the driving TFT of the second light-emitting element, and the reference numeral 403c denotes a part of an capacitor element formed between the source region and the gate electrode of the driving TFT. Next, an insulating film mainly containing silicon which is to be a gate insulating film 404 is formed after cleaning the surface of the silicon film with etchant including hydrofluoric acid.

Then, a known conductive film, herein a laminated film of tantalum nitride and tungsten is formed and etched to have a desired shape, thereby forming gate electrodes (gate wirings) 405a and 405b.

Next, an impurity element (such as P or As) that gives n-type to a semiconductor and an impurity element (such as B) that gives p-type thereto, herein phosphorus and boron, are doped appropriately, and source regions and drain regions of an n-channel TFT and a p-channel TFT are formed.

A part of the switching TFT 407a is etched to expose a part of the source region of the semiconductor region 403a, and then, a conductive film is formed and etched to have a desired shape, thereby forming a source electrode 406 that is in contact with the source region of the switching TFT 407a.

Next, after a second insulating film (not shown in the figure) is formed over the substrate, a heat treatment or irradiation of intense light is performed to activate the doped impurity element. This step enables recovery from plasma damages of the gate insulating film, and an interface between the gate insulating film and the semiconductor film at the same time as activation.

Acrylic resin is applied over the second insulating film. In this embodiment, positive photosensitive acrylic resin is used. After that, the positive photosensitive acrylic resin is exposed to light in photolithography process and organic resin is developed to form a first interlayer insulating film 408. The first interlayer insulating film has a first opening portion having a curvature and thus, has an effect that coverage of an electrode to be formed later is increased. In addition, since the photosensitive acrylic resin is used, the first opening portion can be formed by the development and light-exposure without forming a resist mask. It is not necessary to perform ashing of the resist mask or to remove it by a peeling solution, and thus the number of steps can be reduced.

Then, a known transparent conductive film, herein ITO, is formed and etched to have a desired shape, thereby forming a row electrode 409.

Figure 5A:
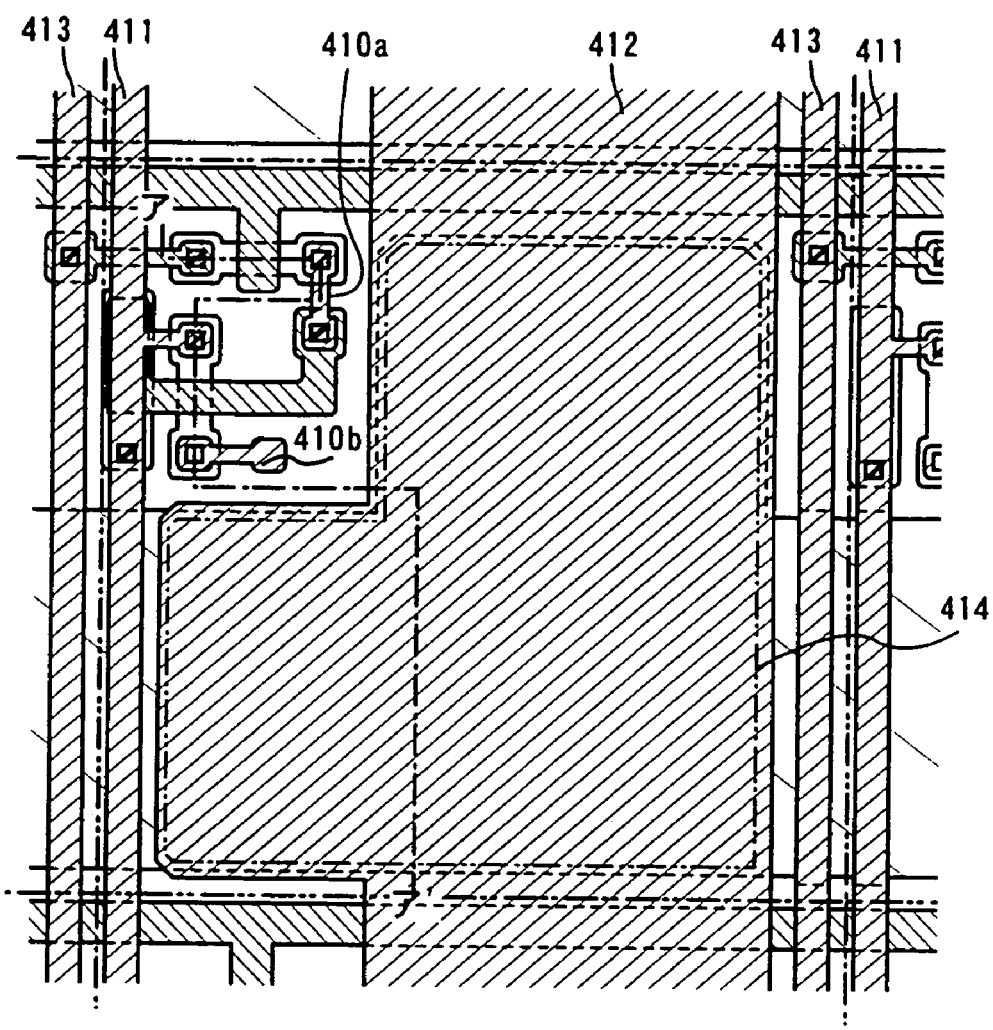
FIGS. 5A and 5B each show steps of manufacturing a light-emitting device according to the present invention.
Figure 5B:
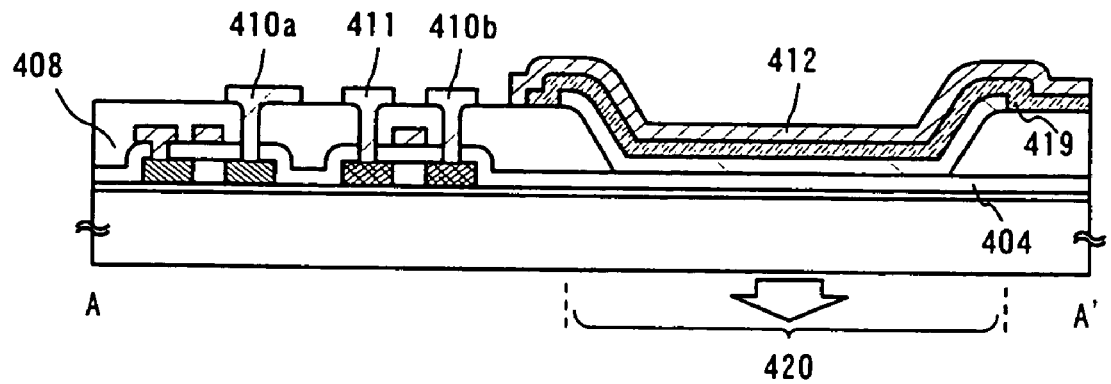

FIGS. 5A and 5B show steps of forming a light-emitting material containing layer and a second electrode of a first light-emitting element and a TFT of the second light-emitting element. FIG. 5A is a top view and FIG. 5B is a cross-sectional view taken along A-A' in FIG. 5A.

A first light-emitting material containing layer 419 is formed over the first pixel electrode (row electrode) 409 of the first light-emitting element. A laminate structure in which CuPc of 20 nm thick, α-NPD of 30 nm thick, and $Alq_3$ of 50 nm thick are formed is used for a green light-emitting element. Then, Ag—Mg of from 1 nm to 10 nm thick and an ITO of from 50 nm to 200 nm thick are laminated and etched to have a desired shape, thereby forming a second pixel electrode (column electrode) 412 of the first light-emitting element. In FIG. 5A, a light-emitting region of the first light-emitting element is denoted by reference numeral 420. It should be noted that the first light-emitting material containing layer appropriately forms not only a green light-emitting element but also a red light-emitting element or a blue light-emitting element by using the materials described in Embodiment Mode 4 as appropriate.

Then, the first interlayer insulating film 408, a second insulating film, and the gate insulating film 404 are etched to expose a drain region of the switching TFT, and source and drain regions of the driving TFT. Thereafter, a known conductive film, herein a titanium film (100 nm in thickness)/an aluminum-silicon alloy film (350 nm in thickness)/a titanium film (100 nm in thickness) (Ti/Al—Si/Ti), is laminated and etched to have a desired shape, thereby forming a source electrode 411 and drain electrodes 410a and 410b. Note that a source electrode 411 of a driving TFT 407b is a part of the source electrode signal line in this embodiment. The light-emitting region of the first light-emitting element is denoted by reference numeral 420.

The source and drain electrodes can be also formed by applying a metal solution to the first opening portion region by ink-jetting. In this case, steps of forming and removing a resist mask can be eliminated.

Figure 6A:
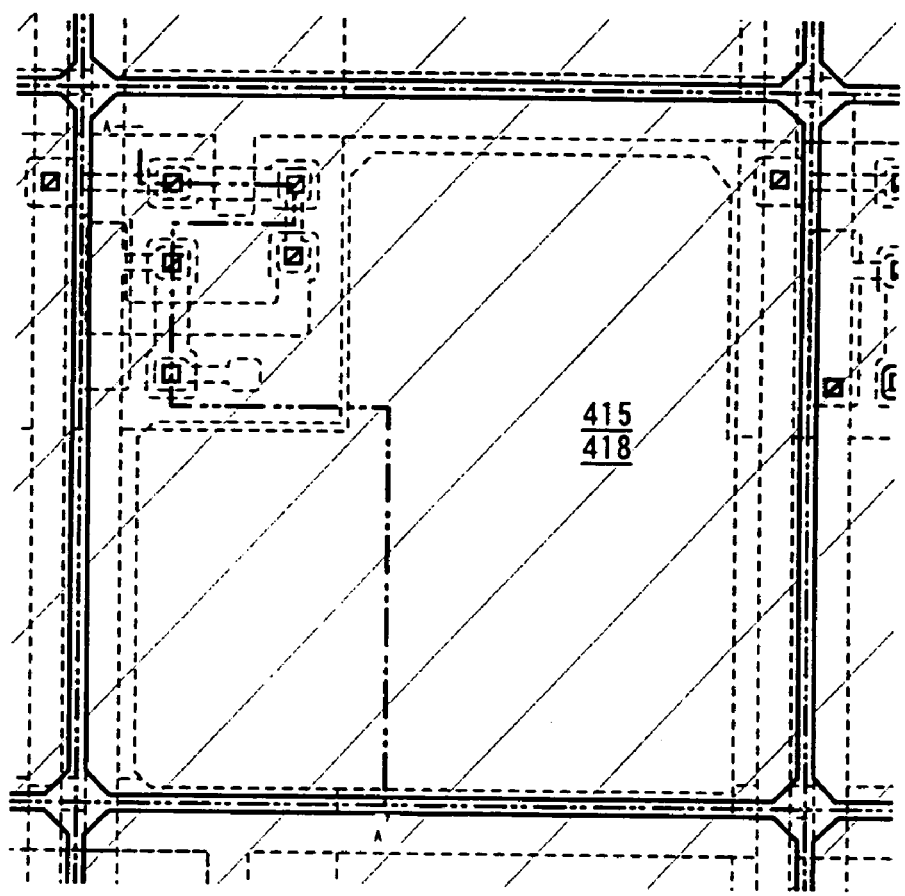
FIGS. 6A and 6B each show steps of manufacturing a light-emitting device according to the present invention.
Figure 6B:
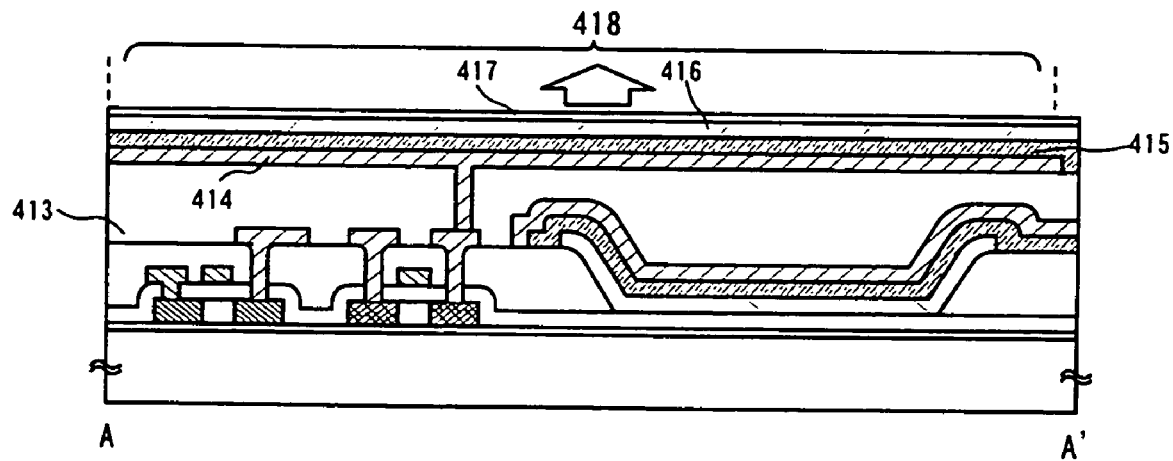

FIGS. 6A and 6B show steps of forming a second light-emitting element. FIG 6A is a top view and FIG. 6B is a cross-sectional view taken along A-A' in FIG. 6A.

An insulating film is formed over a whole surface of the substrate as the second interlayer insulating film 413. In this embodiment, non-photosensitive acrylic resin is used as the second interlayer insulating film. Next, the second interlayer insulating film is etched partially to expose a part of a drain electrode of the driving TFT 407b. Thereafter, a known conductive film, herein an Ag film is formed, and then an ITO film is laminated thereon and they are etched to have a desired shape, thereby forming a first pixel electrode 414 of the second light-emitting element.

Then, a second light-emitting material containing layer 415 is formed in a pixel portion and a second pixel electrode 416 is formed thereover. A laminate structure in which $Alq_3$ of 50 nm thick, α-NPD of 30 nm thick, and CuPc of 20 nm thick are formed is used as the second light-emitting material containing layer. It should be noted that the second light-emitting material containing layer appropriately forms not only a green light-emitting element but also a red light-emitting element or a blue light-emitting element by using the materials described in Embodiment Mode 4 as appropriate, like the first light-emitting material containing layer.

A transparent protective film 417 is formed from a silicon nitride oxide film (SiNO(N>O)) or a silicon oxynitride film (SiON (O>N)) over the whole surface of the substrate to prevent water and oxygen from entering.

Figure 7:
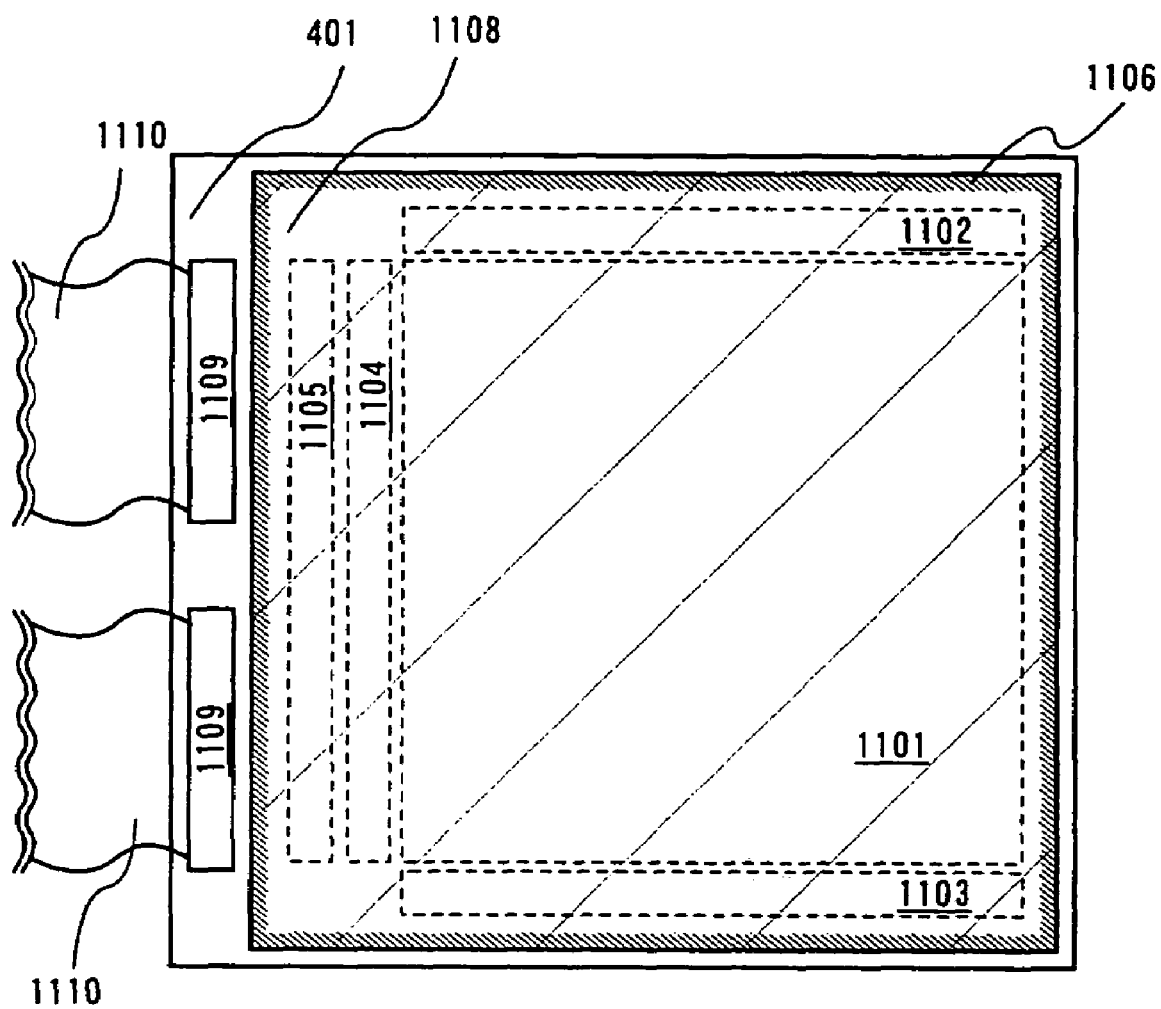
FIG. 7 shows a light-emitting device according to the present invention.

As shown in FIG. 7, a pixel driver circuit is provided for the substrate in which a pixel portion is formed. The pixel driver circuit is a CMOS circuit having an n-channel TFT and a p-channel TFT. Thus, a display device in which the driver circuit and the pixel portion are formed over the same substrate can be obtained.

FIG. 7 is a top view of a light-emitting device. In FIG. 7, a region surrounded by a dotted line 1101 is a pixel portion, reference numeral 1102 denotes a source signal line driver circuit of a first light-emitting element, reference numeral 1104 denotes a gate signal line driver circuit of the first light-emitting element. Reference numeral 1103 denotes a column electrode driver circuit of a second light-emitting element, reference numeral 1105 denotes a row electrode driver circuit of the second light-emitting element, reference numeral 1108 denotes an opposite substrate, and reference numeral 1106 denotes a sealing agent containing a gap material for keeping the space between the pair of substrates. The inside surrounded by the sealing agent 1106 is filled with a sealant. In this embodiment, epoxy resin having high viscosity and including a filler is employed.

An external input terminal 1110 such as FPC (Flexible Printed Circuit), TAB (Tape Automated Bonding), or TCP (Tape Carrier Package) is provided and signals such as video signals or clock signals to be inputted to the source signal line driver circuit 1102, the column electrode driver circuit 1103, the gate signal line driver circuit 1104, and the row electrode driver circuit 1105 are transmitted through a connection wiring 1109. Although the FPC is shown alone, a printed wiring board (PWB) may be attached to the FPC.

In this embodiment, manufacturing steps of the light-emitting device described in Embodiment Mode 1 are explained, but the present embodiment can be applied to the manufacturing steps of the light-emitting device described in Embodiment Mode 2.

Embodiment 2

This embodiment explains an example of a structure of a light-emitting device in which at least a pixel portion, a driver circuit for driving a pixel, and an image processing circuit are formed over a substrate having an insulating surface, and an operation method for reducing consumption power.

Figure 11:
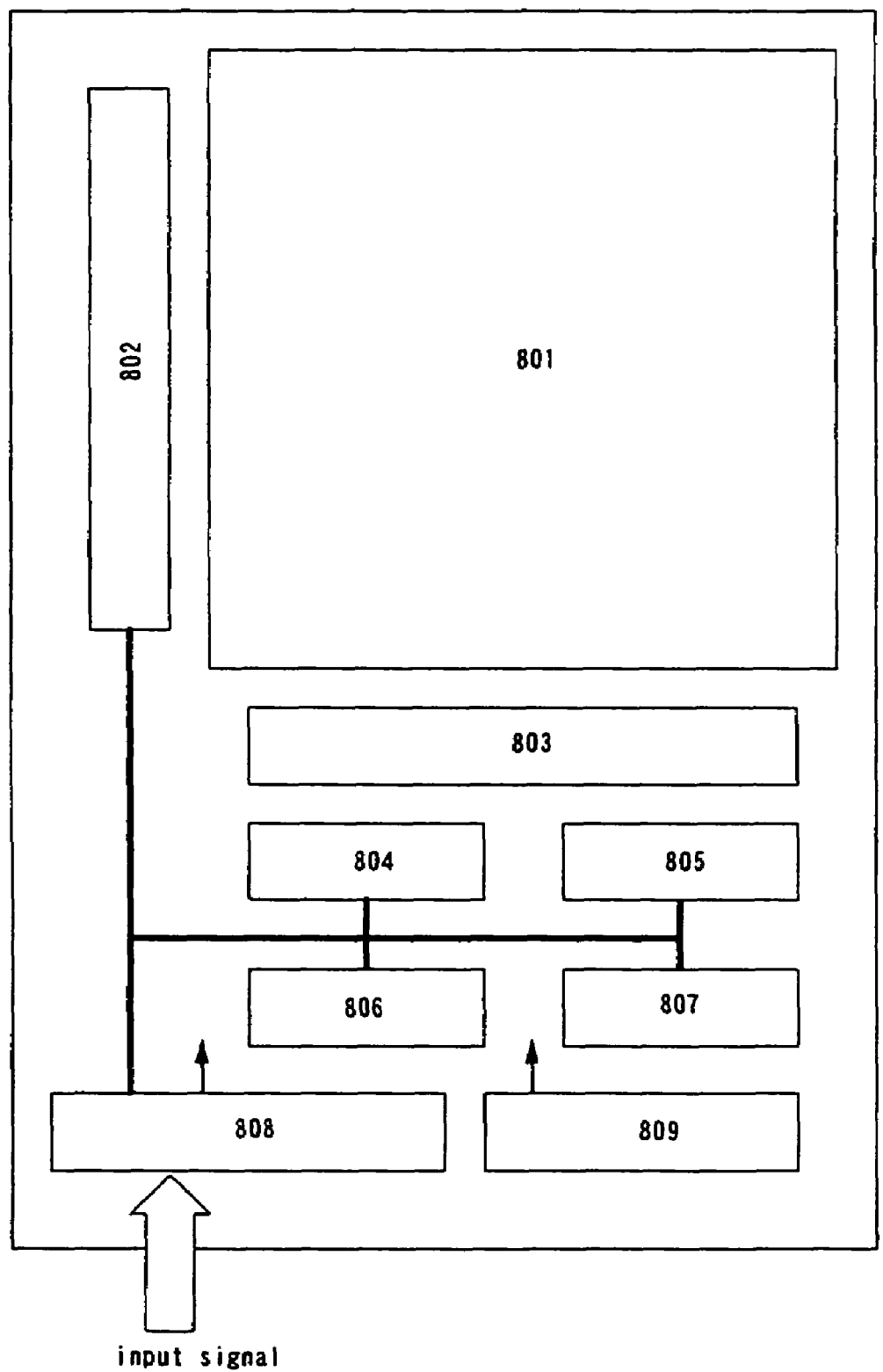
FIG. 11 is a system-block diagram of a light-emitting device.

FIG. 11 is an example of a system having a display portion that is formed over a glass substrate, and a pixel portion 801, a source line driver circuit 802, a gate line driver circuit 803, three image processing circuits 804 to 806 having different functions, a memory 807, an interface circuit 808, and a power supply timing control circuit 809 are provided over the glass substrate.

In the block diagram shown in FIG. 11, the pixel portion 801 is a portion for displaying images, and the source line driver circuit 802 and the gate line driver circuit 803 are driver circuits for driving pixels. Image data is inputted into the source line driver circuit 802. Image data or data to be a basis of images is inputted into the interface circuit 808 from outside, converted into suitable internal signals, and then, ouputted into the source line driver circuit 802, the image processing circuits 804 to 806, or the memory 807.

Various image processing using the three image processing circuits 804 to 806 and the memory 807 can be performed as a function of the light-emitting device. For example, by using one or plural image processing circuits, correction of image distortion; image conversions such as resize, mosaic process, scroll, and inversion; multiwindow process; image generation using the memory 807; and composite process thereof and the like can be performed.

According to this, various modes can be devised. In the light-emitting device having this structure, a nonvolatile latch circuit is suitable for a resistor and a latch circuit of the image processing circuits 804 to 806. In other words, a structure that the logic state of the image processing circuits 804 to 806 can be recovered by the nonvolatile latch circuit is effective. Thus, it is possible to shut off the power while keeping the operation state of the image processing circuits 804 to 806 and to shut off the power of the image processing circuit that is not used. As a result, power consumption can be reduced.

At the standby time, keeping the state of the system, power supply can be stopped, and thus, it is possible to perform high-speed transition between standby time and operation time and to realize the reduction of the power consumption at the standby time at the same time.

Switching the operation mode is controlled by the power supply timing control circuit 809. Concretely, storing operation and recovering operation may be performed on an image processing circuit that is not used, before and after switching modes according to the operation mode.

In this embodiment, the case where whole image processing circuits 804 to 806 can be recovered is described, but the present invention is not limited thereto. A structure in which logic state of one circuit (e.g. circuit C) of the image processing circuits 804 to 806 can be recovered may be employed. In that case, it is possible to supply power to the circuit C only when the circuit C is used, and thus, the power consumption can be reduced.

The nonvolatile latch circuit can be applied to the interface circuit, the source line driver circuit, or a gate line driver circuit. As a result, when respective logic circuits do not operate, the power of the logic circuit is shut off, thereby reducing the power consumption.

This embodiment can be freely combined with any structure of Embodiment Modes 1 to 5 and Embodiment 1.

Embodiment 3

This embodiment describes electronic devices each having a light-emitting device formed in Embodiment Modes 1 to 5 and Embodiments 1 and 2. Such electronic devices typically include a video camera, a digital camera, a laptop personal computer, a personal digital assistant (such as a mobile computer, a portable telephone, a portable game machine, or an electronic book), an image reproduction device having a recording medium (specifically, a device having a display that can reproduce a recording medium such as a digital versatile disc (DVD) and can display the image), a TV image receiver, an electric signboard, a cash register, and the like. A case of applying a light-emitting device of the present invention to a portable telephone as a representative example thereof is shown in this embodiment.

Figure 9A:
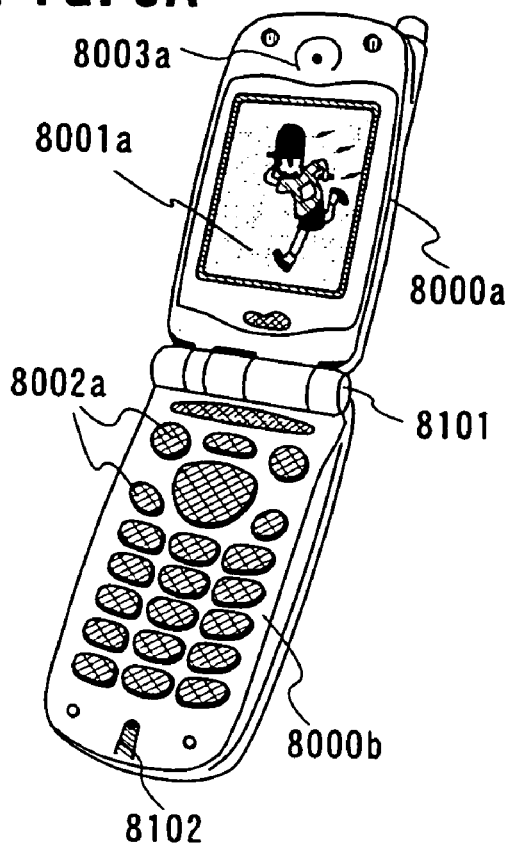
FIGS. 9A to 9D each show an example of electronic devices according to the present invention.
Figure 9B:
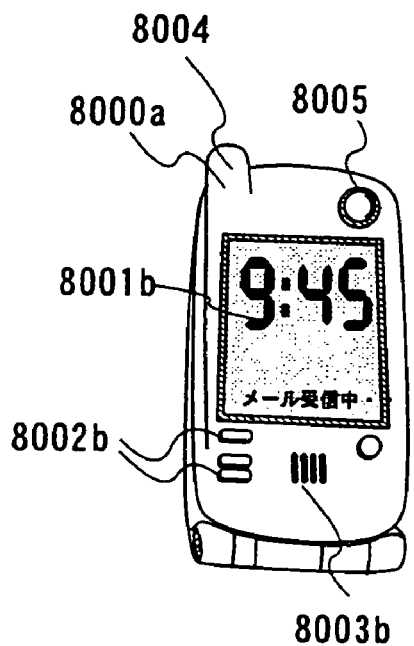

FIGS. 9A to 9D are overviews of a portable telephone of the present invention. FIG. 9A is a perspective view of a state in which the portable telephone is open. FIG. 9B is a perspective view of a state in which the portable telephone is closed, and the perspective view is seen from a first casing side where a second display screen is provided.

In the portable telephone, two casings (a first casing 8000*a* and a second casing 8000*b*) are connected to each other by a hinge 8101 and can be rotated with the hinge 8101 as a center.

A first display screen 8001*a*, a second display screen 8001*b*, operation buttons 8002*b*, speakers 8003*a* and 8003*b*, an antenna 8004, a camera lens 8005, and the like are provided in the first casing 8000*a*.

On the other hand, the second casing 8000*b* has operation buttons 8002*a*, a microphone 8102, and the like.

When the portable telephone is open, the first display screen 8001*a* is employed as a main display screen. The screen operation is performed by using the operation buttons 8002*a*. When the portable telephone is closed, the second screen 8001*b* is employed as a main display screen. In this case, operation of display information is performed by the operation buttons 8002*b*.

Figure 9C:
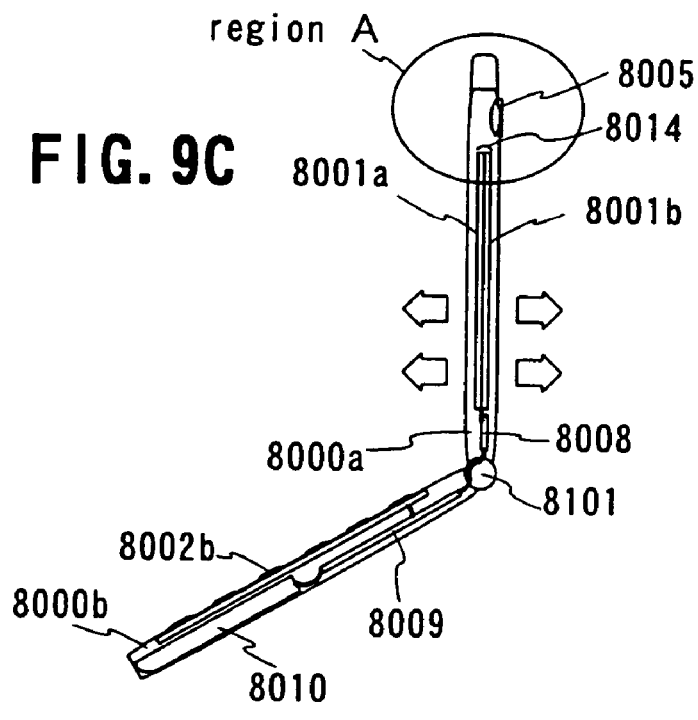

FIG. 9C is a cross-sectional view in which the portable telephone of FIG. 9A is seen from the side. A display controller 8008 connected to a display portion is provided inside the first casing 8000*a*, and controls display content. A battery 8010 and a main body driving module 8009 are formed inside the second casing 8000*b* and the display portion, the display controller 8008, the main body driving module 8009, and the like are driven by using electric power generated in the battery 8010.

Figure 9D:
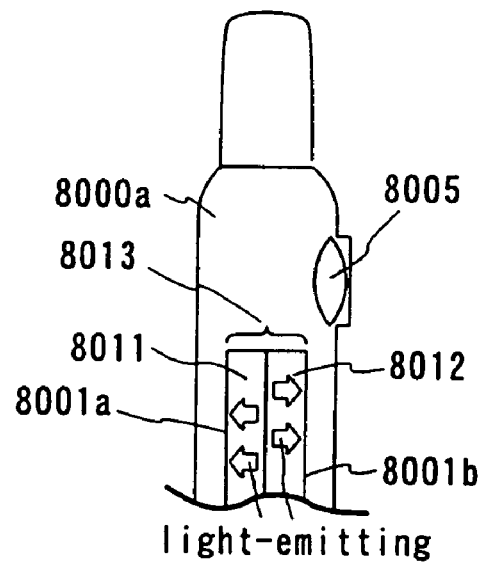

FIG. 9D is a view in which a region A of FIG. 9C is magnified. The first display screen 8001*a* and the second display screen 8001*b* each display images emitted from the display portion 8013 (including a light-emitting element formed between a substrate 8011 and an opposite substrate 8012).

The light-emitting device shown in Embodiment Modes 1 to 5 and Embodiments 1 and 2 is applied to the display portion 8013 in this embodiment. Thus, it is possible to display images in two display screens (the first display screen 8001*a* and the second display screen 8001*b*) of one light-emitting device and to display information suitable for the content of each display screen. For example, the light-emitting element that can display in the first display portion is active matrix driving type and the light-emitting element that can display in the second display portion is passive matrix driving type or a light-emitting element for area color, thereby displaying high-definition images or moving images in the first display portion and simple information such as time or a state of incoming mails in the second display portion.

Further, two display devices are conventionally required to display images in the first screen and the second screen. However, because it is possible to display in different display screens in one display device in this embodiment, the volume and weight of the portable telephone can be reduced and miniaturization of devices is possible.

In relationship of space, the display portion having the second display screen incorporates only a display screen occupying a small display area conventionally. However, according to the present invention, since the second display screen 8001*b* having the same display size as the first display screen 8001*a* can be provided, higher added value can be realized.

Embodiment 4

A cash resister is shown in this embodiment as an example of electronic devices applying Embodiment Modes 1 to 5 and Embodiments 1 and 2.

Figure 10:
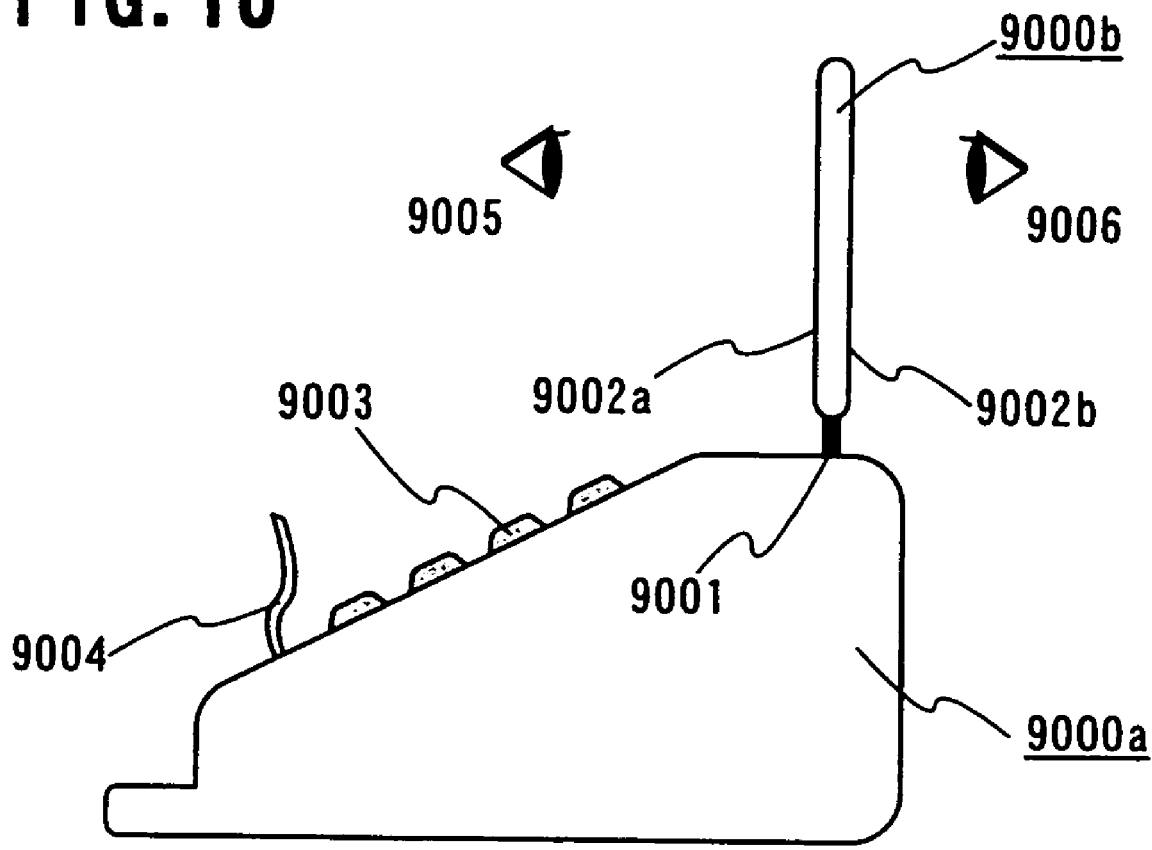
FIG. 10 shows an example of an electronic device according to the present invention.

FIG. 10 is a cross-sectional view of a cash register according to the present invention. In the cash register, a first casing 9000*a* and a second casing 9000*b* are connected by a hinge 9001, and the second casing 9000*b* can be rotated.

An operation button 9003 and an outlet port for receipt 9004 are provided in the first casing 9000*a*. A first display portion 9002*a* and a second display portion 9002*b* are provided for opposite sides of the second casing 9000*b*. The first display portion 9002*a* faces a cashier 9005 and the second display portion 9002*b* faces a purchaser 9006.

When a light-emitting device of the present invention is applied to the first display portion 9002*a* and the second display portion 9002*b*, two display screens can be provided in one display device. As a result, the thickness and weight of the display portion can be reduced, and the device can be more thinned. A calculated value for goods is displayed in the first display portion and advertisements or TV images are displayed in the second display portion. Thus, the purchaser can watch the advertisements, the TV images, or the like and obtain advertisement information about goods during the idle time, while the cashier is calculating values of goods.

According to the present invention, it is possible to display in both front and back sides and to independently display images on the both sides. Further, the present invention provides a light-emitting device having a higher aperture ratio, which is obtained by adding the aperture ratios of the both sides.

Since an electronic device using a display device of the present invention can independently display images on the front and back sides, the same image can be seen on the both display screens without sense of discomfort. Further, it is also possible to see different images on the both sides. Moreover, higher added-value such as weight saving and thinning of electronic devices having plural display portions can be realized.

This application is based on Japanese Patent Application serial no. 2003-187152 filed in Japan Patent Office on 30, Jun., 2003, the contents of which are hereby incorporated by reference.

Although the present invention has been fully described by way of Embodiment Modes and Embodiments with reference to the accompanying drawings, it is to be understood that various changes and modifications will be apparent to those skilled in the art. Therefore, unless otherwise such changes and modifications depart from the scope of the present invention hereinafter defined, they should be constructed as being included therein.

What is claimed is:

1. A light-emitting device comprising:
   pixels arranged over a substrate in matrix form, each of said pixels comprising;
   a first light-emitting element over a substrate;
   a semiconductor element of an active first driving matrix electrically connected to a first electrode of the first light-emitting element;
   a second light-emitting element over the first light-emitting element, wherein a row electrode or a column electrode of the second light-emitting element is electrically connected to a second driving matrix different from the active first driving matrix; and
   an insulating film formed over the semiconduductor element and the first light-emitting element, and between the first light-emitting element and the second light-emitting element, wherein the insulating film is configured to electrically isolate the semiconductor of the active first driving matrix from the row or column electrode of the second light-emitting element such that the first and second light emitting elements can be independently controlled, wherein one of the row electrode and the column electrode is in contact with the insulating film formed over the semiconductior element and the light-emitting element, and the other of the row electrode and the column electrode is in contact with a sealing agent, wherein the first light-emitting element emits first light in a first direction, wherein the second light-emitting element emits light in a second direction that is opposite to the first direction, wherein the first light travels to outside of the light emitting device through the substrate in the first direction, and wherein the second light travels to outside of the light emitting device in the second direction.

2. A light-emitting device according to claim 1, wherein the semiconductor element and the first light-emitting element are formed between the second light-emitting element and the substrate.

3. A light-emitting device according to claim 1, wherein the second light-emitting element is a passive matrix driving type.

4. A light-emitting device according to claim 1, wherein the second light-emitting element is a light-emitting element for area color.

5. A light-emitting element according to claim 1, wherein the first light-emitting element or the second light-emitting element is a light-emitting element in which an organic compound emits light.

6. A light-emitting element according to claim 1, wherein the semiconductor element is a thin film transistor, a MOS transistor, an organic transistor or a diode.

7. An electronic device comprising a light-emitting device claimed in claim 1.

8. A light-emitting device comprising:
pixels arranged over a substrate in matrix form, each of said pixels comprising:
a first light-emitting element;
a semiconductor element of an active first driving matrix electrically connected to a first electrode of the first light-emitting element;
a second light emitting element, wherein a row electrode or a column electrode of the second light-emitting element is electrically connected to a second driving matrix different from the active first driving matrix; and
an insulating film formed over the semiconductor element and the second light-emitting element, and between the first light-emitting element and the second light-emitting element, wherein the insulating film is configured to electrically isolate the semiconductor element of the active first driving matrix from the row or column electrode of the second light-emitting element such that the first and second light emitting elements can be independently controlled,
wherein the first light-emitting element has a laminate structure in which the first electrode, a first light-emitting material containing layer, and a second electrode are formed sequentially from the substrate side,
wherein the first light-emitting element emits first light,
wherein the second light-emitting element has a laminate structure in which a third electrode, a second light-emitting material containing layer, and a fourth electrode are formed sequentially from the substrate side,
wherein the second light-emitting element emits second light,
wherein the semiconductor element and the second light-emitting element are formed between the first light-emitting element and the substrate,
wherein the second electrode is light-transparent so that the first light travels to outside of the light-emitting device in a first direction through the second electrode,
wherein the third electrode is light-transparent so that the second light travels to outside of the light-emitting device in a second direction through the third electrode and the substrate, and
wherein the first direction is opposite to the second direction.

9. A light-emitting device according to claim 8, wherein the first electrode and the fourth electrode are each light-transparent and the insulating film is colored.

10. A light-emitting device according to claim 9, wherein the insulating film that is colored comprises organic resin that is dispersed with metal particles, carbon particles, or black pigment.

11. A light-emitting device according to claim 8, wherein the first electrode or the fourth electrode are each light-transparent and the insulating film is colored.

12. A light-emitting device according to claim 11, wherein the insulating film that is colored comprises organic resin that is dispersed with metal particles, carbon particles, or black pigment.

13. A light-emitting device according to claim 8, wherein the second light-emitting element is a passive matrix driving type.

14. A light-emitting device according to claim 8, wherein the second light-emitting element is a light-emitting element for area color.

15. A light-emitting element according to claim 8, wherein the first light-emitting element or the second light-emitting element is a light-emitting element in which an organic compound emits light.

16. A light-emitting element according to claim 8, wherein the semiconductor element is a thin film transistor, a MOS transistor, an organic transistor or a diode.

17. An electronic device comprising a light-emitting device claimed in claim 8.

18. A light-emitting device comprising:
pixels arranged over a substrate in matrix form, each of said pixels comprising:
a first light-emitting element;
a semiconductor element of an active first driving matrix electrically connected to a first electrode of the first light-emitting element;
a second light emitting element, wherein a row electrode or a column electrode of the second light-emitting element is electrically connected to a second driving matrix different from the active first driving matrix; and
an insulating film formed over the semiconductor element and the first light-emitting element, and between the first light-emitting element and the second light-emitting element, wherein the insulating film is configured to electrically isolate the semiconductor element of the active first driving matrix from the row or column electrode of the second light-emitting element such that the first and second light emitting elements can be independently controlled,
wherein one of the row electrode and the column electrode is in contact with the insulating film formed over the semiconductor element and the first light-emitting element, and the other of the row electrode and the column electrode is in contact with a sealing agent, wherein the first light-emitting element has a laminate structure in which the first electrode, a first light-emitting material containing layer, and a second electrode are formed sequentially from the substrate side, wherein the first light-emitting element emits first light, wherein the second light-emitting element has a laminate structure in which a third electrode, a second light-emitting material containing layer, and a fourth electrode are formed sequentially from the substrate side, wherein the second light-emitting element emits second light, wherein the semiconductor element and the first light-emitting element are formed between the second light-emitting element and the substrate, wherein the first electrode is light-transparent so that the first light travels to outside of the light-emitting device in a first direction through the first electrode and the substrate, wherein the fourth electrode is light-transparent so that the second light travels to outside of the light-emitting device in a second direction through the fourth electrode, and wherein the first direction is opposite to the second direction.

19. A light-emitting device according to claim 18, wherein the second electrode and the third electrode are each light-transparent and the insulating film is colored.

20. A light-emitting device according to claim 19, wherein the insulating film that is colored comprises organic resin that is dispersed with metal particles, carbon particles, or black pigment.

21. A light-emitting device according to claim 18, wherein the second electrode or the third electrode is light-transparent and the insulating film is colored.

22. A light-emitting device according to claim 21, wherein the insulating film that is colored comprises organic resin that is dispersed with metal particles, carbon particles, or black pigment.

23. A light-emitting device according to claim 18, wherein the second light-emitting element is a passive matrix driving type.

24. A light-emitting device according to claim 18, the second light-emitting element is a light-emitting element for area color.

25. A light-emitting element according to claim 18, wherein the first light-emitting element or the second light-emitting element is a light-emitting element in which an organic compound emits light.

26. A light-emitting element according to claim 18, wherein the semiconductor element is a thin film transistor, a MOS transistor, an organic transistor or a diode.

27. An electronic device comprising a light-emitting device claimed in claim 18.

28. A light-emitting device comprising:
pixels arranged over a substrate in matrix form, each of said pixels comprising:
a first light-emitting element electrically connected to a row electrode or a column electrode of a first driving matrix over the substrate;
a second light-emitting element over the first light-emitting element;
a semiconductor element of an active second driving matrix different from the first driving matrix electrically connected to a first electrode of the second light-emitting element; and
an insulating film formed over the semiconductor element and the first light-emitting element, and between the first light-emitting element and the second light-emitting element, wherein the insulating film is configured to electrically isolate the semiconductor element of the active second driving matrix from the row or column electrode of the first driving matrix such that the first and second light emitting elements can be independently controlled,
wherein the first light-emitting element emits first light in a first direction that is opposite to a second direction,
wherein the second light-emitting element emits second light in the second direction,
wherein the first light travels to outside of the light emitting device through the subsrtate in the first direction, and
wherein the second light travels to the outside of the light emmitting device in the second direction.

29. A light-emitting device according to claim 28, wherein the semiconductor element and the first light-emitting element are formed between the second light-emitting element and the substrate.

30. A light-emitting device according to claim 28, the second light-emitting element is a passive matrix driving type.

31. A light-emitting device according to claim 28, wherein and the second light-emitting element is a light-emitting element for area color.

32. A light-emitting device according to claim 28, wherein the first light-emitting element or the second light-emitting element is a light-emitting element in which an organic compound emits light.

33. A light-emitting device according to claim 28, wherein the semiconductor element is a thin film transistor, a MOS transistor, an organic transistor or a diode.

34. An electronic device comprising a light-emitting device claimed in claim 28.

* * * * *